United States Patent
Liss et al.

(10) Patent No.: US 10,205,939 B2
(45) Date of Patent: Feb. 12, 2019

(54) METHODS AND APPARATUS FOR AUTOMATIC TV ON/OFF DETECTION

(71) Applicant: The Nielsen Company (US), LLC, New York, NY (US)

(72) Inventors: Michael Jordan Liss, Maitland, FL (US); Richard Lee Horner, St. Petersburg, FL (US); Charles Clinton Conklin, New Port Richey, FL (US); James Joseph Vitt, Palm Harbor, FL (US)

(73) Assignee: The Nielsen Company (US), LLC, New York, NY (US)

( * ) Notice: Subject to any disclaimer, the term of this patent is extended or adjusted under 35 U.S.C. 154(b) by 0 days.

(21) Appl. No.: 15/633,394

(22) Filed: Jun. 26, 2017

(65) Prior Publication Data

US 2017/0295364 A1  Oct. 12, 2017

Related U.S. Application Data

(63) Continuation of application No. 13/473,320, filed on May 16, 2012, now Pat. No. 9,692,535.
(Continued)

(51) Int. Cl.
*H04N 5/64* (2006.01)
*G01R 35/00* (2006.01)
(Continued)

(52) U.S. Cl.
CPC ......... *H04N 17/004* (2013.01); *G01R 35/005* (2013.01); *H04H 60/32* (2013.01);
(Continued)

(58) Field of Classification Search
CPC .. H04N 17/004; H04N 5/64; H04N 21/44213; G01R 35/005
(Continued)

(56) References Cited

U.S. PATENT DOCUMENTS 2,855,993 A  10/1958  Rahmel
3,281,695 A  10/1966  Bass
(Continued)

FOREIGN PATENT DOCUMENTS

AU  2006279518  2/2007
CA  2777579  11/2012
(Continued)

OTHER PUBLICATIONS

Andrieu et al., "Bayesian Blind Marginal Separation of Convolutively Mixed Discrete Sources," Proceedings of the 1998 IEEE Signal Processing Society Workshop, Department of Engineering, Cambridge, UK, 1998 (10 pages).
(Continued)

*Primary Examiner* — Nathan J Flynn
*Assistant Examiner* — Caroline Somera
(74) *Attorney, Agent, or Firm* — Hanley, Flight & Zimmerman, LLC

(57) ABSTRACT

Methods and apparatus to determine a power state of an information presentation device. The method includes measuring power drawn by the information presentation device during a calibration period to generate a log of measurement values, determining, by executing an instruction with a processor, respective counts indicating respective numbers of times respective different ones of the measurement values were detected during the calibration period, and determining, by executing an instruction with the processor, a first threshold based on at least one of the counts. The method also includes determining whether the presentation device is in an ON state based on a comparison of measured power drawn by the information presentation device after the calibration period to the first threshold.

19 Claims, 15 Drawing Sheets

Related U.S. Application Data

(60) Provisional application No. 61/600,894, filed on Feb. 20, 2012.

(51) Int. Cl.
    *H04H 60/32* (2008.01)
    *H04N 17/00* (2006.01)
    *H04N 21/442* (2011.01)

(52) U.S. Cl.
    CPC ......... *H04N 5/64* (2013.01); *G09G 2330/021* (2013.01); *G09G 2370/04* (2013.01); *H04N 21/44213* (2013.01)

(58) Field of Classification Search
    USPC .......................................................... 348/18
    See application file for complete search history.

(56) References Cited

U.S. PATENT DOCUMENTS

| | | |
|---|---|---|
| 3,315,160 A | 4/1967 | Goodman |
| 3,483,327 A | 12/1969 | Schwartz |
| 3,633,112 A | 1/1972 | Anderson |
| 3,651,471 A | 3/1972 | Haselwood et al. |
| 3,733,430 A | 5/1973 | Thompson et al. |
| 3,803,349 A | 4/1974 | Watanabe |
| 3,906,454 A | 9/1975 | Martin |
| 3,947,624 A | 3/1976 | Miyake |
| 4,027,332 A | 5/1977 | Wu et al. |
| 4,044,376 A | 8/1977 | Porter |
| 4,058,829 A | 11/1977 | Thompson |
| 4,230,990 A | 10/1980 | Lert, Jr. et al. |
| 4,245,245 A | 1/1981 | Matsumoto et al. |
| 4,388,644 A | 6/1983 | Ishman et al. |
| 4,546,382 A | 10/1985 | McKenna et al. |
| 4,566,030 A | 1/1986 | Nickerson et al. |
| 4,574,304 A | 3/1986 | Watanabe et al. |
| 4,613,904 A | 9/1986 | Lurie |
| 4,622,583 A | 11/1986 | Watanabe et al. |
| 4,642,685 A | 2/1987 | Roberts et al. |
| 4,644,393 A | 2/1987 | Smith et al. |
| 4,647,964 A | 3/1987 | Weinblatt |
| 4,658,290 A | 4/1987 | McKenna et al. |
| 4,697,209 A | 9/1987 | Kiewit et al. |
| 4,723,302 A | 2/1988 | Fulmer et al. |
| 4,764,808 A | 8/1988 | Solar |
| 4,769,697 A | 9/1988 | Gilley et al. |
| 4,779,198 A | 10/1988 | Lurie |
| 4,800,437 A | 1/1989 | Hosoya |
| 4,807,031 A | 2/1989 | Broughton et al. |
| 4,876,736 A | 10/1989 | Kiewit |
| 4,885,632 A | 12/1989 | Mabey et al. |
| 4,905,080 A | 2/1990 | Watanabe et al. |
| 4,907,079 A | 3/1990 | Turner et al. |
| 4,912,552 A | 3/1990 | Allison, III et al. |
| 4,930,011 A | 5/1990 | Kiewit |
| 4,931,865 A | 6/1990 | Scarampi |
| 4,943,963 A | 7/1990 | Waechter et al. |
| 4,965,825 A | 10/1990 | Harvey et al. |
| 4,972,503 A | 11/1990 | Zurlinden |
| 5,034,902 A | 7/1991 | Steinmann |
| 5,097,328 A | 3/1992 | Boyette |
| 5,136,644 A | 8/1992 | Audebert et al. |
| 5,165,069 A | 11/1992 | Vitt et al. |
| 5,226,177 A | 7/1993 | Nickerson |
| 5,235,414 A | 8/1993 | Cohen |
| 5,251,324 A | 10/1993 | McMullan, Jr. |
| 5,310,222 A | 5/1994 | Chatwin et al. |
| 5,319,453 A | 6/1994 | Copriviza et al. |
| 5,335,277 A | 8/1994 | Harvey et al. |
| 5,355,161 A | 10/1994 | Bird et al. |
| 5,374,951 A | 12/1994 | Welsh |
| 5,398,055 A | 3/1995 | Nonomura et al. |
| 5,404,161 A | 4/1995 | Douglass et al. |
| 5,404,172 A | 4/1995 | Berman et al. |
| 5,408,258 A | 4/1995 | Kolessar |
| 5,425,100 A | 6/1995 | Thomas et al. |
| 5,448,554 A | 9/1995 | Van Steenbrugge |
| 5,481,294 A | 1/1996 | Thomas et al. |
| 5,483,276 A | 1/1996 | Brooks et al. |
| 5,488,408 A | 1/1996 | Maduzia et al. |
| 5,495,282 A | 2/1996 | Mostafa et al. |
| 5,505,901 A | 4/1996 | Harney et al. |
| 5,512,933 A | 4/1996 | Wheatley et al. |
| 5,550,928 A | 8/1996 | Lu et al. |
| 5,581,800 A | 12/1996 | Fardeau et al. |
| 5,608,445 A | 3/1997 | Mischler |
| 5,629,739 A | 5/1997 | Dougherty |
| 5,630,203 A | 5/1997 | Weinblatt |
| 5,631,995 A | 5/1997 | Weissensteiner et al. |
| 5,659,367 A | 8/1997 | Yuen |
| 5,760,760 A | 6/1998 | Helms |
| 5,767,922 A | 6/1998 | Zabih et al. |
| 5,771,307 A | 6/1998 | Lu et al. |
| 5,787,334 A | 7/1998 | Fardeau et al. |
| 5,801,747 A | 9/1998 | Bedard |
| 5,844,636 A | 12/1998 | Joseph et al. |
| 5,872,588 A | 2/1999 | Aras et al. |
| 5,874,724 A | 2/1999 | Cato |
| 5,889,548 A | 3/1999 | Chan |
| 5,896,554 A | 4/1999 | Itoh et al. |
| 5,929,941 A | 7/1999 | Tsuchiya et al. |
| 5,963,844 A | 10/1999 | Dail |
| 6,035,177 A | 3/2000 | Moses et al. |
| 6,049,286 A | 4/2000 | Forr |
| 6,124,877 A | 9/2000 | Schmidt |
| 6,137,539 A | 10/2000 | Lownes et al. |
| 6,154,548 A | 11/2000 | Bizzan |
| 6,175,634 B1 | 1/2001 | Graumann |
| 6,177,931 B1 | 1/2001 | Alexander et al. |
| 6,184,918 B1 | 2/2001 | Goldschmidt Iki et al. |
| 6,202,210 B1 | 3/2001 | Ludtke |
| 6,272,176 B1 | 8/2001 | Srinivasan |
| 6,286,140 B1 | 9/2001 | Ivanyi |
| 6,297,859 B1 | 10/2001 | George |
| 6,311,214 B1 | 10/2001 | Rhoads |
| 6,388,662 B2 | 5/2002 | Narui et al. |
| 6,389,403 B1 | 5/2002 | Dorak, Jr. |
| 6,400,996 B1 | 6/2002 | Hoffberg et al. |
| 6,405,370 B1 | 6/2002 | Jarrell |
| 6,421,445 B1 | 7/2002 | Jensen et al. |
| 6,457,010 B1 | 9/2002 | Eldering et al. |
| 6,460,018 B1 | 10/2002 | Kasai et al. |
| 6,463,413 B1 | 10/2002 | Applebaum et al. |
| 6,467,089 B1 | 10/2002 | Aust et al. |
| 6,477,508 B1 | 11/2002 | Lazar et al. |
| 6,487,719 B1 | 11/2002 | Itoh et al. |
| 6,496,862 B1 | 12/2002 | Akatsu et al. |
| 6,519,769 B1 | 2/2003 | Hopple et al. |
| 6,523,175 B1 | 2/2003 | Chan |
| 6,529,212 B2 | 3/2003 | Miller et al. |
| 6,542,878 B1 | 4/2003 | Heckerman et al. |
| 6,567,978 B1 | 5/2003 | Jarrell |
| 6,570,559 B1 | 5/2003 | Oshima |
| 6,647,212 B1 | 11/2003 | Toriumi et al. |
| 6,647,548 B1 | 11/2003 | Lu et al. |
| 6,675,383 B1 | 1/2004 | Wheeler et al. |
| 6,681,396 B1 | 1/2004 | Bates et al. |
| 6,700,893 B1 | 3/2004 | Radha et al. |
| 6,704,929 B1 | 3/2004 | Ozer et al. |
| 6,779,198 B1 | 8/2004 | Morinaga et al. |
| 6,791,472 B1 | 9/2004 | Hoffberg |
| 6,792,469 B1 | 9/2004 | Callahan et al. |
| 6,934,508 B2 | 8/2005 | Ceresoli et al. |
| 6,946,803 B2 | 9/2005 | Moore |
| 6,954,745 B2 | 10/2005 | Rajan |
| 6,983,478 B1 | 1/2006 | Grauch et al. |
| 7,051,352 B1 | 5/2006 | Schaffer |
| 7,100,181 B2 | 8/2006 | Srinivasan et al. |
| 7,150,030 B1 | 12/2006 | Eldering et al. |
| 7,359,528 B2 | 4/2008 | Rhoads |
| 7,404,016 B2 | 7/2008 | Emerson et al. |
| 7,587,732 B2 | 9/2009 | Wright et al. |
| 7,647,604 B2 | 1/2010 | Ramaswamy |

(56) References Cited

U.S. PATENT DOCUMENTS

| | | |
|---|---|---|
| 7,690,017 B2 | 3/2010 | Stecyk et al. |
| 7,712,114 B2 | 5/2010 | Ramaswamy |
| 7,739,718 B1 | 6/2010 | Young et al. |
| 7,786,987 B2 | 8/2010 | Nielsen |
| 7,827,319 B2 | 11/2010 | Kimura et al. |
| 7,882,514 B2 | 2/2011 | Nielsen et al. |
| 7,954,120 B2 | 5/2011 | Roberts et al. |
| 7,958,526 B2 | 6/2011 | Wheeler et al. |
| 8,060,372 B2 | 11/2011 | Topchy et al. |
| 8,108,888 B2 | 1/2012 | Ramaswamy |
| 8,156,517 B2 | 4/2012 | Nielsen |
| 8,180,712 B2 | 5/2012 | Nelson et al. |
| 8,249,992 B2 | 8/2012 | Harkness et al. |
| 8,526,626 B2 | 9/2013 | Nielsen et al. |
| 8,763,022 B2 | 6/2014 | Ramaswamy |
| 8,866,628 B2 | 10/2014 | Laasik et al. |
| 8,924,994 B2 | 12/2014 | Conklin et al. |
| 8,959,556 B2 | 2/2015 | Stokes et al. |
| 2001/0007149 A1 | 7/2001 | Smith |
| 2002/0010919 A1 | 1/2002 | Lu et al. |
| 2002/0012353 A1 | 1/2002 | Gerszberg et al. |
| 2002/0015112 A1 | 2/2002 | Nagakubo et al. |
| 2002/0026635 A1 | 2/2002 | Wheeler et al. |
| 2002/0056087 A1 | 5/2002 | Berezowski et al. |
| 2002/0057893 A1 | 5/2002 | Wood et al. |
| 2002/0059577 A1 | 5/2002 | Lu et al. |
| 2002/0072952 A1 | 6/2002 | Hamzy et al. |
| 2002/0073419 A1 | 6/2002 | Yen et al. |
| 2002/0077880 A1 | 6/2002 | Gordon et al. |
| 2002/0078441 A1 | 6/2002 | Drake et al. |
| 2002/0080286 A1 | 6/2002 | Dagtas et al. |
| 2002/0083435 A1 | 6/2002 | Blasko et al. |
| 2002/0129368 A1 | 9/2002 | Schlack et al. |
| 2002/0141730 A1 | 10/2002 | Haken |
| 2002/0173911 A1 | 11/2002 | Brunet et al. |
| 2002/0174425 A1 | 11/2002 | Markel et al. |
| 2002/0194592 A1 | 12/2002 | Tsuchida et al. |
| 2002/0198762 A1 | 12/2002 | Donato |
| 2003/0005432 A1 | 1/2003 | Ellis et al. |
| 2003/0023967 A1 | 1/2003 | Kim |
| 2003/0046685 A1 | 3/2003 | Srinivasan et al. |
| 2003/0054757 A1 | 3/2003 | Kolessar et al. |
| 2003/0056215 A1 | 3/2003 | Kanungo |
| 2003/0067459 A1 | 4/2003 | Lim |
| 2003/0093790 A1 | 5/2003 | Logan et al. |
| 2003/0101449 A1 | 5/2003 | Bentolila et al. |
| 2003/0110485 A1 | 6/2003 | Lu et al. |
| 2003/0115591 A1 | 6/2003 | Weissmueller, Jr. et al. |
| 2003/0131350 A1 | 7/2003 | Peiffer et al. |
| 2003/0151415 A1* | 8/2003 | Randall .............. G01R 35/04 |
| | | 324/601 |
| 2003/0216120 A1 | 11/2003 | Ceresoli et al. |
| 2004/0003394 A1 | 1/2004 | Ramaswamy |
| 2004/0055020 A1 | 3/2004 | Delpuch |
| 2004/0058675 A1 | 3/2004 | Lu et al. |
| 2004/0068737 A1 | 4/2004 | Itoh et al. |
| 2004/0073918 A1 | 4/2004 | Ferman et al. |
| 2004/0088212 A1 | 5/2004 | Hill |
| 2004/0088721 A1 | 5/2004 | Wheeler et al. |
| 2004/0100437 A1 | 5/2004 | Hunter et al. |
| 2004/0116067 A1 | 6/2004 | Karaoguz et al. |
| 2004/0117816 A1 | 6/2004 | Karaoguz et al. |
| 2004/0181799 A1 | 9/2004 | Lu et al. |
| 2004/0210922 A1 | 10/2004 | Peiffer et al. |
| 2004/0254887 A1 | 12/2004 | Jacoby |
| 2005/0054285 A1 | 3/2005 | Mears et al. |
| 2005/0057550 A1 | 3/2005 | George |
| 2005/0066210 A1 | 3/2005 | Chen |
| 2005/0086334 A1 | 4/2005 | Aaltonen et al. |
| 2005/0125820 A1 | 6/2005 | Nelson et al. |
| 2005/0221774 A1 | 10/2005 | Ceresoli et al. |
| 2005/0278731 A1 | 12/2005 | Cameron et al. |
| 2005/0286860 A1 | 12/2005 | Conklin |
| 2005/0289613 A1 | 12/2005 | Lawrence |
| 2006/0026628 A1 | 2/2006 | Wan et al. |
| 2006/0026653 A1 | 2/2006 | Matsunami |
| 2006/0062401 A1 | 3/2006 | Neervoort et al. |
| 2006/0075420 A1 | 4/2006 | Ludvig et al. |
| 2006/0075421 A1 | 4/2006 | Roberts et al. |
| 2006/0080314 A1 | 4/2006 | Hubert et al. |
| 2006/0093998 A1 | 5/2006 | Vertegaal |
| 2006/0184780 A1 | 8/2006 | Yamada et al. |
| 2006/0195857 A1 | 8/2006 | Wheeler et al. |
| 2006/0200844 A1 | 9/2006 | Jitsuhara |
| 2006/0212895 A1 | 9/2006 | Johnson |
| 2006/0225106 A1 | 10/2006 | Bedingfield, Sr. |
| 2006/0232575 A1 | 10/2006 | Nielsen |
| 2007/0011040 A1 | 1/2007 | Wright et al. |
| 2007/0050806 A1 | 3/2007 | Chan |
| 2007/0050832 A1 | 3/2007 | Wright et al. |
| 2007/0053513 A1 | 3/2007 | Hoffberg |
| 2007/0061830 A1 | 3/2007 | Chang |
| 2007/0063850 A1 | 3/2007 | Devaul et al. |
| 2007/0186228 A1 | 8/2007 | Ramaswamy et al. |
| 2007/0186229 A1 | 8/2007 | Conklin et al. |
| 2007/0192782 A1 | 8/2007 | Ramaswamy |
| 2007/0288628 A1 | 12/2007 | Sadovsky et al. |
| 2007/0288981 A1 | 12/2007 | Mitsuse et al. |
| 2008/0025707 A1 | 1/2008 | Sawada et al. |
| 2008/0028427 A1 | 1/2008 | Nesvadba et al. |
| 2008/0056675 A1 | 3/2008 | Wright et al. |
| 2008/0082661 A1 | 4/2008 | Huber |
| 2008/0097656 A1* | 4/2008 | Desai .............. G06F 1/28 |
| | | 700/295 |
| 2008/0098426 A1 | 4/2008 | Candelore |
| 2008/0104650 A1 | 5/2008 | Keener et al. |
| 2008/0120440 A1 | 5/2008 | Balasubramanian et al. |
| 2008/0148307 A1 | 6/2008 | Nielsen et al. |
| 2008/0148309 A1 | 6/2008 | Wilcox et al. |
| 2008/0229127 A1* | 9/2008 | Felter .............. G06F 1/3203 |
| | | 713/320 |
| 2008/0244680 A1 | 10/2008 | Mochizuki |
| 2008/0263579 A1 | 10/2008 | Mears et al. |
| 2008/0276265 A1 | 11/2008 | Topchy et al. |
| 2009/0158361 A1 | 6/2009 | Tsusaka et al. |
| 2009/0178087 A1 | 7/2009 | Menn et al. |
| 2009/0192805 A1 | 7/2009 | Topchy et al. |
| 2009/0225994 A1 | 9/2009 | Topchy et al. |
| 2009/0241148 A1 | 9/2009 | Lo |
| 2009/0259325 A1 | 10/2009 | Topchy et al. |
| 2009/0260027 A1 | 10/2009 | Weinblatt |
| 2010/0079597 A1 | 4/2010 | Stokes et al. |
| 2010/0083299 A1 | 4/2010 | Nelson et al. |
| 2010/0125890 A1 | 5/2010 | Levine et al. |
| 2010/0162285 A1 | 6/2010 | Cohen et al. |
| 2010/0169908 A1 | 7/2010 | Nielsen |
| 2010/0205639 A1 | 8/2010 | Vavelidis et al. |
| 2010/0211967 A1 | 8/2010 | Ramaswamy et al. |
| 2010/0218206 A1 | 8/2010 | Biemans |
| 2010/0245678 A1 | 9/2010 | Hill-Jowett |
| 2011/0016231 A1 | 1/2011 | Ramaswamy et al. |
| 2011/0126222 A1 | 5/2011 | Wright et al. |
| 2011/0228838 A1 | 9/2011 | Yang et al. |
| 2011/0288858 A1 | 11/2011 | Gay et al. |
| 2012/0102515 A1 | 4/2012 | Ramaswamy |
| 2012/0102518 A1 | 4/2012 | Wheeler et al. |
| 2012/0180083 A1 | 7/2012 | Marcus |
| 2012/0203731 A1 | 8/2012 | Nelson et al. |
| 2012/0311620 A1 | 12/2012 | Conklin et al. |
| 2012/0320280 A1 | 12/2012 | Waites et al. |
| 2013/0160042 A1 | 6/2013 | Stokes et al. |
| 2014/0007153 A1 | 1/2014 | Nielsen et al. |
| 2014/0208140 A1 | 7/2014 | Brooks et al. |
| 2014/0250449 A1 | 9/2014 | Ramaswamy |
| 2014/0298367 A1 | 10/2014 | Lee |
| 2014/0316773 A1 | 10/2014 | Beerends |
| 2014/0380348 A1 | 12/2014 | Shankar et al. |
| 2014/0380349 A1 | 12/2014 | Shankar et al. |
| 2014/0380350 A1 | 12/2014 | Shankar et al. |

FOREIGN PATENT DOCUMENTS

| | | |
|---|---|---|
| CN | 1244982 | 2/2000 |
| CN | 102981418 | 3/2013 |

(56) References Cited

FOREIGN PATENT DOCUMENTS

| | | |
|---|---|---|
| DE | 3401762 | 8/1985 |
| DE | 3742426 | 6/1989 |
| EP | 0283570 | 9/1988 |
| EP | 0593202 | 4/1994 |
| EP | 0843468 | 5/1998 |
| EP | 0946012 | 9/1999 |
| EP | 1100265 | 5/2001 |
| EP | 1160772 | 12/2001 |
| EP | 1318676 | 6/2003 |
| EP | 1318679 | 6/2003 |
| EP | 1411326 | 4/2004 |
| EP | 1586045 | 10/2005 |
| FR | 2738977 | 3/1997 |
| FR | 2745144 | 8/1997 |
| GB | 1574964 | 9/1980 |
| GB | 2265736 | 10/1993 |
| GB | 2406451 | 3/2005 |
| JP | 63084396 | 4/1988 |
| JP | 8331482 | 12/1996 |
| JP | 2000307520 | 11/2000 |
| JP | 2003323362 | 11/2003 |
| JP | 2005020233 | 1/2005 |
| JP | 2006254297 | 9/2006 |
| JP | 2010171606 | 5/2010 |
| WO | 9115062 | 10/1991 |
| WO | 9217027 | 10/1992 |
| WO | 9410799 | 5/1994 |
| WO | 9417609 | 8/1994 |
| WO | 9512278 | 5/1995 |
| WO | 9526106 | 9/1995 |
| WO | 9806193 | 2/1998 |
| WO | 9810539 | 3/1998 |
| WO | 9831114 | 7/1998 |
| WO | 9832251 | 7/1998 |
| WO | 9933206 | 7/1999 |
| WO | 9959275 | 11/1999 |
| WO | 0038360 | 6/2000 |
| WO | 0072484 | 11/2000 |
| WO | 0111506 | 2/2001 |
| WO | 0145103 | 6/2001 |
| WO | 0161892 | 8/2001 |
| WO | 0165747 | 9/2001 |
| WO | 0219581 | 3/2002 |
| WO | 02052759 | 7/2002 |
| WO | 03049339 | 6/2003 |
| WO | 03052552 | 6/2003 |
| WO | 03060630 | 7/2003 |
| WO | 2004051997 | 6/2004 |
| WO | 2005032145 | 4/2005 |
| WO | 2005038625 | 4/2005 |
| WO | 2005041166 | 5/2005 |
| WO | 2005055601 | 6/2005 |
| WO | 2005065159 | 7/2005 |
| WO | 2005079457 | 9/2005 |
| WO | 2005079941 | 9/2005 |
| WO | 2005125198 | 12/2005 |
| WO | 2006012629 | 2/2006 |
| WO | 2006014495 | 2/2006 |
| WO | 2006020560 | 2/2006 |
| WO | 2006037631 | 4/2006 |
| WO | 2006055897 | 5/2006 |
| WO | 2007022250 | 2/2007 |
| WO | 2007048124 | 4/2007 |
| WO | 2007120518 | 10/2007 |
| WO | 2008033136 | 3/2008 |
| WO | 2011115945 | 9/2011 |

OTHER PUBLICATIONS

Belinfante et al., "Specification Based Formal Testing: The Easy Link Case Study," 2nd Progress Workshop on Embedded Systems, 2001, Oct. 18, 2001 (10 pages).
Boccaccio, Jeff, "Inside HDMI CEC: The Little-Known Control Feature," News, HDMI Corner, Wire and Cable, Dec. 28, 2007, retrieved from <http://www.cepro.com/article/inside_hdmi_cec_the_little_known_control_feature/K5>, retrieved on Feb. 9, 2009 (3 pages).
BPR, Ltd., "The SCART Connector," 2003 (6 pages).
Canadian Intellectual Property Office, "Office Action," issued in connection with Canadian Patent Application No. 2,777,579, dated Mar. 10, 2014 (2 pages).
Doe, Pete, "Bringing Set Top Box Data to Life," ARF Audience Measurement Symposium 2.0, New York City, Jun. 26, 2007 (9 pages).
European Patent Office, "Communication Pursuant to Rules 161(2) and 162 EPC," issued in connection with European Patent Application No. 12859807.7, dated Aug. 1, 2014 (3 pages).
European Patent Office, "Extended Search Report," issued in connection with European Patent Application No. 12004179.3, dated Oct. 18, 2013 (7 pages).
European Patent Office, "Extended European Search Report," issued in connection with European Application No. 06801611.2, dated Mar. 2, 2012 (5 pages).
European Patent Office, "Communication Pursuant to Article 94(3) EPC," issued in connection with European Application No. 110099558.7, dated Mar. 20, 2013 (4 pages).
European Patent Office, "Extended European Search Report," issued in connection with European Application No. 09013713.4, dated Dec. 1, 2009 (8 pages).
Friess, Steve, "Nielsen, TiVo Try Ratings Game," Wired.com, Sep. 13, 2002, retrieved from <http://www.wired.com/print/entertainment/music/news/2002/09/55091>, retrieved on Feb. 9, 2009 (2 pages).
Gardiner et al., "Digital Television Project Provision of Technical Assistance, Preliminary Investigation of a SCART Lead Benchmarking Scheme," DTG Management Services, Ltd., Feb. 7, 2005 (27 pages).
Hitachi, Ltd. et al., "High-Definition Multimedia Interface, Specification Version 1.3a," Nov. 10, 2006 (276 pages).
Instituto Mexicano De La Propiedad Industrial, "Office Action," issued in connection with Mexican Patent Application No. MX/a/2008/002317, dated Aug. 19, 2010 (2 pages).
Intellectual Property Office of New Zealand, "Examination Report and Notice of Acceptance of Complete Specification," issued in connection with New Zealand Application No. 553385 dated May 27, 2010 (2 pages).
International Searching Authority, "International Search Report," issued in connection with International Patent Application No. PCT/US1992/002211, dated Jul. 20, 1992 (1 page).
International Searching Authority, "International Search Report," issued in connection with International Patent Application No. PCT/US1998/00091, dated Apr. 28, 1998 (2 pages).
International Searching Authority, "International Search Report," issued in connection with International Patent Application No. PCT/US2000/005104, dated Sep. 28, 2001 (3 pages).
International Searching Authority, "International Search Report," issued in connection with International Patent Application No. PCT/US2002/038012, dated May 22, 2003 (2 pages).
International Searching Authority, "International Search Report," issued in connection with International Patent Application No. PCT/US2005/005079, dated Jun. 17, 2005 (2 pages).
International Searching Authority, "International Search Report," issued in connection with International Patent Application No. PCT/US2005/023995, dated Dec. 23, 2005 (1 page).
International Searching Authority, "International Search Report," issued in connection with International Patent Application No. PCT/EP2005/010739, dated Apr. 26, 2006 (4 pages).
International Searching Authority, "International Search Report," issued in connection with International Patent Application No. PCT/US2005/042108, dated Aug. 17, 2006 (1 page).
International Searching Authority, "International Search Report," issued in connection with International Patent Application No. PCT/US2005/026426, dated Aug. 18, 2006 (1 page).
International Searching Authority, "International Search Report," issued in connection with International Patent Application No. PCT/US2006/060118, dated Mar. 14, 2008 (1 page).

(56) References Cited

OTHER PUBLICATIONS

International Searching Authority, "International Search Report," issued in connection with International Patent Application No. PCT/US2005/005064, dated Sep. 25, 2008 (1 page).
International Searching Authority, "International Preliminary Report on Patentability," issued in connection with International Patent Application No. PCT/US2012/070362, dated Jun. 24, 2014 (9 pages).
International Searching Authority, "International Search Report and Written Opinion," issued in connection with International Patent Application No. PCT/US2012/070362, dated Apr. 30, 2013 (11 pages).
International Searching Authority, "International Report on Patentability," issued in connection with International Patent Application No. PCT/US2003/030355, dated Mar. 18, 2011 (5 pages).
International Searching Authority, "International Search Report," issued in connection with International Patent Application No. PCT/US2005/028106, dated Mar. 12, 2007 (5 pages).
IP Australia, "Notice of Acceptance," issued in connection with Australian Patent Application No. 2005273948 dated Jan. 20, 2010 (3 pages).
IP Australia, "Examiner's Report," issued in connection with Australian Patent Application No. 2012327192, dated Aug. 6, 2014 (3 pages).
IP Australia, "Notice of Acceptance," issued in connection with Australian Patent Application No. 2012203037, dated Jul. 30, 2014 (2 pages).
IP Australia, "Patent Examination Report 1," issued in connection with Australian Patent Application No. 2012203037, dated May 23, 2013 (4 pages).
IP Australia, "Patent Examination Report 1," issued in connection with Australian Patent Application No. 2013203338, dated Sep. 30, 2014 (3 pages).
IP Australia, "Notice of Acceptance," issued in connection with Australian Application No. 2006279518 dated May 28, 2010 (4 pages).
Japan Patent Office, "Notice of Reasons for Rejection," issued in connection with Japanese Patent Application No. P2012-118947, dated Aug. 27, 2013 (4 pages).
Jones et al., "CEC-Enabled HDMI System Design for Multi-Vendor Compatibility," Video/Imaging Design Line. Jun. 20, 2008, retrieved from <http://www.videsignline.com/20800828;jsessionid=EUZGUQ0PO5OIOQSNDLOSKHS . . . >, retrieved on Aug. 15, 2008 (9 pages).
NXP Semiconductors, Product Data Sheet of "TDA 9950 CEC/FC-bus Translator," Philips, released on Nov. 16, 2007 (24 pages).
Patents, Registry, Intellectual Property Department of Hong Kong, "Grant of Request for Registration and Grant," issued in connection with Hong Kong Application No. 09101551.0, dated Mar. 22, 2011 (5 pages).
Quantum Data, "Designing CEC into your Next HDMI Product," retrieved from <http://www.quantumdata.com> (11 pages).
Rajan et al., " Bayesian Approach to Parameter Estimation and Interpolation of Time-Varying Autoregressive Process Using the Gibbs Sampler," IEE Proceedings: Vision, Image and Signal Processing 144.4 (1997) (8 pages).
State Intellectual Property Office of China, "Notice of Allowance," issued in connection with Chinese Patent Application No. 200580030202.X dated Jun. 21, 2013 (5 pages).
State Intellectual Property Office of China, "First Office Action," issued in connection with Chinese Patent Application No. 201210175375.2, dated May 12, 2014 (3 pages).
State Intellectual Property Office of China, "Fourth Office Action," issued in connection with Chinese Patent Application No. 200580030202.X dated Mar. 18, 2013 (6 pages).
State Intellectual Property Office of China, "First Office Action," issued in connection with Chinese Patent Application No. 200680036510.8, dated Jul. 10, 2009 (10 pages).
State Intellectual Property Office of China, "Second Office Action," issued in connection with Chinese Patent Application No. 200680036510.8, dated Mar. 24, 2010 (5 pages).
State Intellectual Property Office of China, "Second Office Action," issued in connection with Chinese Patent Application No. 201210175375.2, dated Jan. 6, 2015 (12 pages).
State Intellectual Property Office of China, "Office Action," issued in connection with Chinese Patent Application No. 201110288875.2, dated Jul. 18, 2014 (6 pages).
State Intellectual Property Office of China, "Office Action," issued in connection with Chinese Patent Application No. 201110288875.2, dated Oct. 30, 2013 (8 pages).
Svenska Elektriska Kommissionen, SEK, English language translation of "Domestic and Similar Electronic Equipment Interconnection Requirements: AV.Link," U.S. Appl. No. SS-EN 50157-1, Jul. 1998 (20 pages).
Svenska Elektriska Kommissionen, SEK, English language translation of "Domestic and Similar Electronic Equipment Interconnection Requirements: AV.Link," Serial No. SS-EN 50 157-2-1, Apr. 1996, (33 pages).
Svenska Elektriska Kommissionen, SEK, English language translation of "Domestic and Similar Electronic Equipment Interconnection Requirements: AV.Link," Serial No. SS-EN 50157-2-2, Aug. 1998 (18 pages).
Svenska Elektriska Kommissionen, SEK, English language translation of "Domestic and Similar Electronic Equipment Interconnection Requirements: AV.Link," Serial No. SS-EN 50157-2-3, Aug. 1998 (12 pages).
United States Patent and Trademark Office, "Advisory Action," issued in connection with U.S. Appl. No. 11/388,555, dated Mar. 22, 2010 (3 pages).
United States Patent and Trademark Office, "Final Office Action," issued in connection with U.S. Appl. No. 11/388,262, dated Oct. 12, 2010 (11 pages).
United States Patent and Trademark Office, "Final Office Action," issued in connection with U.S. Appl. No. 11/388,262, dated Sep. 2, 2009 (12 pages).
United States Patent and Trademark Office, "Final Office Action," issued in connection with U.S. Appl. No. 11/388,555, dated Dec. 8, 2009 (12 pages).
United States Patent and Trademark Office, "Final Office Action," issued in connection with U.S. Appl. No. 11/388,555, dated Oct. 6, 2008 (10 pages).
United States Patent and Trademark Office, "Final Office Action," issued in connection with U.S. Appl. No. 13/149,500, dated May 21, 2013 (14 pages).
United States Patent and Trademark Office, "Final Office Action," issued in connection with U.S. Appl. No. 13/718,878, dated Jan. 6, 2015 (17 pages).
United States Patent and Trademark Office, "Non-Final Office Action," issued in connection with U.S. Appl. No. 11/388,262, dated Apr. 28, 2010 (11 pages).
United States Patent and Trademark Office, "Non-Final Office Action," issued in connection with U.S. Appl. No. 11/388,262, dated Mar. 5, 2009 (9 pages).
United States Patent and Trademark Office, "Non-Final Office Action," issued in connection with U.S. Appl. No. 11/388,555, dated Dec. 27, 2007 (6 pages).
United States Patent and Trademark Office, "Non-Final Office Action," issued in connection with U.S. Appl. No. 11/388,555, dated Mar. 31, 2009 (9 pages).
United States Patent and Trademark Office, "Non-Final Office Action," issued in connection with U.S. Appl. No. 13/149,500, dated Oct. 25, 2012 (12 pages).
United States Patent and Trademark Office, "Non-Final Office Action," issued in connection with U.S. Appl. No. 13/718,878, dated Jul. 14, 2014 (12 pages).
United States Patent and Trademark Office, "Advisory Action," issued in connection with U.S. Appl. No. 11/388,555, dated Jan. 13, 2009 (4 pages).
United States Patent and Trademark Office, "Notice of Allowance," issued in connection with U.S. Appl. No. 11/388,555, dated May 20, 2010 (4 pages).

(56) References Cited

OTHER PUBLICATIONS

United States Patent and Trademark Office, "Notice of Allowance," issued in connection with U.S. Appl. No. 12/725,018, dated Sep. 28, 2011 (7 pages).
United States Patent and Trademark Office, "Notice of Allowance," issued in connection with U.S. Appl. No. 13/149,500, dated Apr. 9, 2014 (11 pages).
United States Patent and Trademark Office, "Notice of Allowance," issued in connection with U.S. Appl. No. 13/149,500, dated Jul. 30, 2014 (18 pages).
United States Patent and Trademark Office, "Requirement for Restriction/Election," issued in connection with U.S. Appl. No. 13/149,500, dated Jul. 25, 2012 (6 pages).
United States Patent and Trademark Office, "Non-Final Office Action," issued in connection with U.S. Appl. No. 11/576,328, dated Feb. 5, 2009 (13 pages).
United States Patent and Trademark Office, "Non-Final Office Action," issued in connection with U.S. Appl. No. 11/576,328, dated Aug. 7, 2009 (10 pages).
United States Patent and Trademark Office, "Non-Final Office Action," issued in connection with U.S. Appl. No. 11/672,706, dated Jul. 23, 2009 (7 pages).
United States Patent and Trademark Office, "Notice of Allowance," issued in connection with U.S. Appl. No. 11/576,328, dated Apr. 7, 2010 (8 pages).
United States Patent and Trademark Office, "Notice of Allowance," issued in connection with U.S. Appl. No. 11/672,706, dated Dec. 31, 2009 (6 pages).
United States Patent and Trademark Office, "Notice of Allowance," issued in connection with U.S. Appl. No. 12/242,337, dated Jan. 12, 2012 (8 pages).
United States Patent and Trademark Office, "Notice of Allowance," issued in connection with U.S. Appl. No. 12/242,337, dated Sep. 12, 2011 (8 pages).
United States Patent and Trademark Office, "Notice of Allowance," issued in connection with U.S. Appl. No. 12/240,683, dated Oct. 9, 2014 (15 pages).
United States Patent and Trademark Office, "Non-Final Office Action," issued in connection with U.S. Appl. No. 12/240,683, dated Feb. 14, 2012 (7 pages).
United States Patent and Trademark Office, "Final Office Action," issued in connection with U.S. Appl. No. 12/240,683, dated Dec. 21, 2012 (14 pages).
United States Patent and Trademark Office, "Notice of Allowance" issued in connection with U.S. Appl. No. 13/341,575, dated Oct. 28, 2013 (9 pages).
United States Patent and Trademark Office, "Non-Final Office Action" issued in connection with U.S. Appl. No. 13/341,575, dated Jul. 10, 2013 (11 pages).
United States Patent and Trademark Office, "Non-Final Office Action" issued in connection with U.S. Appl. No. 13/473,320, dated May 12, 2015 (29 pages).
United States Patent and Trademark Office, "Final Office Action" issued in connection with U.S. Appl. No. 13/473,320, dated Nov. 20, 2015 (9 pages).
United States Patent and Trademark Office, "Non-Final Office Action" issued in connection with U.S. Appl. No. 13/473,320, dated Jul. 26, 2016 (12 pages).
United States Patent and Trademark Office, "Notice of Allowance" issued in connection with U.S. Appl. No. 13/473,320, dated Feb. 23, 2017 (23 pages).
Austrian Patent Office Service and Information Center (TRF), "Written Opinion," issued in connection with Singaporean Patent Application No. 200700990-5, dated Jun. 23, 2009 (4 pages).
Canadian Intellectual Property Office, "Office Action," issued in connection with Canadian Patent Application No. 2,576,865, dated Jun. 17, 2011 (3 pages).
Canadian Intellectual Property Office, "Office Action," issued in connection with Canadian Patent Application No. 2,576,865, dated Mar. 29, 2010 (5 pages).

Canadian Intellectual Property Office, "Notice of Allowance," issued in connection with Canadian Patent Application No. 2,576,865, dated Oct. 2, 2012 (1 page).
Dai et al., "Transferring Naïve Bayes Classifiers for Text Classification," Proceedings of the Twenty-Second AAAI Conference on Artificial Intelligence, Jul. 22-26, 2007 (6 pages).
Domingos et al., "On the Optimality of the Simple Bayesian Classifier Under Zero-One Loss," Machine Learning, vol. 29, No. 2, Nov. 1, 1997, pp. 103-130 (28 pages).
Elkan, Charles, "Naïve Bayesian Learning," Adapted from Technical Report No. CS97-557, Department of Computer Science and Engineering, University of California, San Diego, Sep. 1997 (4 pages).
European Patent Office, "Examination Report," issued in connection with European Patent Application No. 05798239.9, dated Dec. 27, 2010 (4 pages).
European Patent Office, "Communication Pursuant to Article 94(3) EPC," issued in connection with European Patent Application No. 05798239.9, dated Dec. 8, 2009 (5 pages).
European Patent Office, "Extended European Search Report," issued in connection with European Patent Application No. 05798239.9, dated Sep. 9, 2008 (4 pages).
European Patent Office, "Summons to Attend Oral Proceedings Pursuant to Rule 115(1) EPC," issued in connection with European Patent Application No. 05798239.9, dated Dec. 22, 2011 (3 pages).
European Patent Office, "Communication Pursuant to Rule 62a(1) EPC and Rule 63(1) EPC," issued in connection with European Patent Application No. 11009958.7, dated Mar. 27, 2012 (3 pages).
European Patent Office, "Extended European Search Report," issued in connection with European Patent Application No. 11009958.7, dated Jul. 18, 2012 (10 pages).
European Patent Office, "Extended European Search Report," issued in connection with European Patent Application No. 06801611.2, dated Mar. 2, 2012 (5 pages).
Intellectual Property Office of New Zealand, "Examination Report," issued in connection with New Zealand Patent Application No. 553385, dated Nov. 18, 2009 (2 pages).
Intellectual Property Office of New Zealand, "Examination Report," issued in connection with New Zealand Patent Application No. 553385, dated Oct. 17, 2008 (2 pages).
International Searching Authority, "Written Opinion," issued in connection with International Patent Application No. PCT/US2003/030355, dated Mar. 21, 2008 (5 pages).
International Searching Authority, "International Search Report," issued in connection with International Patent Application No. PCT/US2003/030355, dated May 5, 2004 (6 pages).
International Searching Authority, "International Preliminary Report on Patentability," issued in connection with International Patent Application No. PCT/US2003/030370, dated Mar. 7, 2005 (4 pages).
International Searching Authority, "International Search Report," issued in connection with International Patent Application No. PCT/US2003/030370, dated Mar. 11, 2004 (7 pages).
International Searching Authority, "Written Opinion," issued in connection with International Patent Application No. PCT/US2003/030370, dated Nov. 15, 2004 (5 pages).
International Searching Authority, "International Preliminary Report on Patentability," issued in connection with International Patent Application No. PCT/US2005/028106, dated Apr. 5, 2007 (5 pages).
International Searching Authority, "International Search Report," issued in connection with International Patent Application No. PCT/US2005/028106, dated Mar. 12, 2007 (2 pages).
International Searching Authority, "Written Opinion," issued in connection with International Patent Application No. PCT/US2005/028106, dated Mar. 12, 2007 (4 pages).
International Searching Authority, "International Search Report," issued in connection with International Patent Application No. PCT/US2006/031960, dated Feb. 21, 2007 (2 pages).
International Searching Authority, "Written Opinion," issued in connection with International Patent Application No. PCT/US2006/031960, dated Feb. 21, 2007 (3 pages).

(56) References Cited

OTHER PUBLICATIONS

International Searching Authority, "International Preliminary Report on Patentability," issued in connection with International Patent Application No. PCT/US2006/031960, dated Feb. 20, 2008 (4 pages).
Instituto Mexicano De La Propiedad Industrial, "Office Action," issued in connection with Mexican Patent Application No. MX/a/2007/001734, dated Jul. 24, 2009 (6 pages).
IP Australia, "Examiner's First Report," issued in connection with Australian Patent Application No. 2005273948, dated May 22, 2009 (2 pages).
IP Australia, "Notice of Acceptance," issued in connection with Australian Patent Application No. 2010201753, dated Apr. 17, 2012 (3 pages).
IP Australia, "Patent Examination Report No. 1," issued in connection with Australian Patent Application No. 2010219320, dated Jun. 20, 2012 (4 pages).
Klein, Dan, "Lecture 23: Naïve Bayes," CS 188: Artificial Intelligence, University of California—Berkeley, Nov. 15, 2007 (6 pages).
Korean Intellectual Property Office, "Notice of Preliminary Rejection," issued in connection with Korean Patent Application No. 10-2007-7005373, dated May 30, 2012 (23 pages).
Korean Intellectual Property Office, "Notice of Allowance," issued in connection with Korean Patent Application No. 10-2007-7005373, dated Dec. 24, 2012 (3 pages).
Korean Intellectual Property Office, "Notice of Preliminary Rejection," issued in connection with Korean Patent Application No. 10-2007-7005373, dated Oct. 31, 2011 (5 pages).
Lang, Marcus, "Implementation of Naïve Bayesian Classifiers in Java," retrieved from <http://www.iit.edu/~ipro356f03/ipro/documents/naïve-bayes.edu>, retrieved dated Feb. 29, 2008 (4 pages).
"Lecture 3: Naïve Bayes Classification," retrieved from <http://www.cs.utoronto.ca/~strider/CSCD11_f08/NaiveBayes_Zemel.pdf>, retrieved on Feb. 29, 2008 (9 pages).
Liang et al., "Learning Naïve Bayes Tree for Conditional Probability Estimation," Proceedings of the Canadian A1-2006 Conference, Jun. 7-9, 2006 (13 pages).
"Logical Connective: Philosophy 103: Introduction to Logic Conjunction, Negation, and Disjunction," retrieved from <http://philosophylander.edu/logic /conjunct.html>, retrieved on Mar. 11, 2009 (5 pages).
Lu et al., "Content Analysis for Audio Classification and Segmentation," IEEE Transactions on Speech and Audio Processing, vol. 10, No. 7, Oct. 2002 (13 pages).
Mitchell, Tom M., "Chapter 1: Generative and Discriminative Classifiers: Naïve Bayes and Logistic Regression," Machine Learning, Sep. 21, 2006 (17 pages).
Mozina et al., "Nomograms for Visualization of Naïve Bayesian Classifier," Proceedings of the Eighth European Conference on Principles and Practice of Knowledge Discovery in Databases, 2004 (12 pages).
Oregon State University, "The Naive Bayes Classifier," retrieved from <http://web.engr.oregonstate.edu/~afrn/classes/cs534/notes/Naivebayes-10.pdf>, retrieved on Feb. 29, 2008 (19 pages).
Oregon State University, "Learning Bayesian Networks: Naïve and Non-Naive Bayes," retrieved from <http://web.engr.oregonstate.edu/~tgd/classes/534/slides/part6.pdf, retrieved on Feb. 29, 2008 (18 pages).
Oregon State University, "Bayesian Networks," Machine Learning A, 708.064 07W 1sst KU, retrieved from <http://www.igi.tugraz.at.lehre /MLA/WS07/slides3.pdf, retrieved on Feb. 29, 2008 (21 pages).
Patron-Perez et al., "A Probabilistic Framework for Recognizing Similar Actions using Spatio-Temporal Features," BMVC07, 2007, retrieved from <http://media.adelaide.edu.au/acvt/Publications/2007/2007-A%20Probabilistic%20Framework%20for%20Recognizing%20Similar%20Actions%20using%20Spatio-Temporal%20Features.pdf>, retrieved on Mar. 23, 2015 (10 pages).
Smith, Leslie S., "Using IIDs to Estimate Sound Source Direction," Proceedings of the Seventh International Conference on Simulation of Adaptive Behavior from Animals to Animats, 2002 (2 pages).
State Intellectual Property of China, "Notice of Decision of Granting Patent Right for Invention," issued in connection with Chinese Patent Application No. 200680036510.8, dated Aug. 9, 2010 (4 pages).
State Intellectual Property of China, "Rejection Decision," issued in connection with Chinese Patent Application No. 200580030202.X, dated Mar. 24, 2011 (9 pages).
State Intellectual Property of China, "First Notification of Office Action," issued in connection with Chinese Patent Application No. 200580030202.X, dated Jun. 5, 2009 (11 pages).
Synaptic, "Classifier Showdown," The Peltarion Blog, Jul. 10, 2006, retrieved from <http://blog.peltarion.com/2006/07/10/classifier-showdown/>, retrieved on Mar. 11, 2009 (14 pages).
Thomas, William L. "Television Audience Research Technology, Today's Systems and Tomorrow's Challenges," Nielsen Media Research, Jun. 5, 1992 (4 pages).
Tsekeridou et al., "Content-Based Video Parsing and Indexing Based on Audio-Visual Interaction," IEEE Transactions on Circuits and Systems for Video Technology, IEEE Service Center, vol. 11, No. 4, Apr. 2001 (14 pages).
United States Patent and Trademark Office, "Final Office Action," issued in connection with U.S. Appl. No. 11/388,555, dated Oct. 6, 2008 (9 pages).
United States Patent and Trademark Office, "Advisory Action," issued in connection with U.S. Appl. No. 11/388,262, dated Jan. 7, 2010 (3 pages).
United States Patent and Trademark Office, "Notice of Allowance," issued in connection with U.S. Appl. No. 12/725,018, dated Jun. 27, 2011 (7 pages).
United States Patent and Trademark Office, "Non-Final Office Action," issued in connection with U.S. Appl. No. 11/388,555, dated Mar. 31, 2009 (10 pages).
United States Patent and Trademark Office, "Non-Final Office Action," issued in connection with U.S. Appl. No. 12/831,870, dated Nov. 29, 2012 (8 pages).
United States Patent and Trademark Office, "Non-Final Office Action," issued in connection with U.S. Appl. No. 11/672,706, dated Jul. 23, 2009 (8 pages).
United States Patent and Trademark Office, "Non-Final Office Action," issued in connection with U.S. Appl. No. 11/576,328, dated Aug. 7, 2009 (11 pages).
United States Patent and Trademark Office, "Notice of Allowance," issued in connection with U.S. Appl. No. 12/831,870, dated Apr. 24, 2013 (8 pages).
Vincent et al., "A Tentative Typology of Audio Source Separation Tasks," 4th International Symposium on Independent Component Analysis and Blind Signal Separation (ICA 2003), held in Nara, Japan, Apr. 2003 (6 pages).
Wikipedia, "Naïve Bayes Classifier," modified Mar. 8, 2009, retrieved from <http://en.wikipedia.org/wiki/Naïve_Bayes>, retrieved on Mar. 11, 2009 (7 pages).
Wikipedia, "Naïve Bayes Classifier," revised Jan. 11, <http://en.wikipedia.org/w/index.php?title=Naïve_Bayes_classifier&diff=183655568&oldid . . . >, retrieved on Mar. 11, 2009 (7 pages).
Zhang, Harry, "The Optimality of Naïve Bayes," Proceedings of the Seventeenth International FLAIRS Conference, 2004 (6 pages).
Zimmerman, H.J., "Fuzzy Set Applications in Pattern Recognition and Data-Analysis," 11th IAPR International conference on Pattern Recognition, Aug. 29, 1992 (80 pages).

* cited by examiner

| | | | | | | | | | | | | | | | | | | |
|---|---|---|---|---|---|---|---|---|---|---|---|---|---|---|---|---|---|---|
| 502 → | POWER MEASUREMENT | 3 | 3 | 3 | 3 | 3 | 3 | 3 | 8 | 15 | 20 | 25 | 30 | 30 | 30 | 30 | 30 | 30 |
| 504 → | RUNNING AVERAGE | 3 | 3 | 3 | 3 | 3 | 3 | 3 | 4 | 6 | 10 | 14 | 20 | 26 | 27 | 29 | 30 | 30 |
| 506 → | LOGGED VALUE | 3 | 3 | 3 | 3 | 3 | 3 | 3 | 3 | 3 | 3 | 3 | 3 | 30 | 30 | 30 | 30 | 30 |

| | | | | | | | | | | | | | | | | | | |
|---|---|---|---|---|---|---|---|---|---|---|---|---|---|---|---|---|---|---|
| 510 → | POWER MEASUREMENT | 3 | 3 | 3 | 3 | 3 | 3 | 3 | 8 | 15 | 20 | 25 | 30 | 30 | 30 | 30 | 30 | 30 |
| 512 → | RUNNING AVERAGE | 3 | 3 | 3 | 3 | 3 | 3 | 3 | 4 | 6 | 10 | 14 | 20 | 26 | 27 | 29 | 30 | 30 |
| 552 → | LOGGED VALUE | 3 | 3 | 3 | 3 | 3 | 3 | 6 | 6 | 14 | 14 | 26 | 26 | 26 | 26 | 26 | 26 | 26 |
| 560 → | FLAG VALUE | 0 | 0 | 0 | 0 | 0 | 0 | 1 | 0 | 1 | 0 | 1 | 0 | 0 | 0 | 0 | 0 | 0 |

| Logged Value | Comparison Criteria |
|---|---|
| 1-2 Watts | 200% |
| 3-6 Watts | 50% |
| 7-15 Watts | 30% |
| 16-25 Watts | 20% |
| > 26 Watts | 10% |

| POWER MEASUREMENT | AMOUNT OF TIME (SECONDS) | PERCENTAGE |
|---|---|---|
| 3 WATTS | 222 | 74% |
| 55 WATTS | 66 | 22% |
| 23 WATTS | 9 | 3% |
| 14 WATTS | 3 | 1% |

| OFF State Power Measurement | OFF Threshold |
|---|---|
| 1 Watt | 3 Watts |
| 2 Watts | 5 Watts |
| 3-10 Watts | OFF x 2 |
| 10-20 Watts | OFF x 1.5 |
| > 20 Watts | OFF x 1.2 |

| ON State Power Measurement | ON Threshold |
|---|---|
| 0-70 Watts | ON x 0.6 |
| 70-100 Watts | ON x 0.7 |
| > 100 Watts | ON x 0.8 |

*FIG. 9*

METHODS AND APPARATUS FOR AUTOMATIC TV ON/OFF DETECTION

RELATED APPLICATION

This patent is a continuation of U.S. patent application Ser. No. 13/473,320, entitled "Methods and Apparatus for Automatic TV ON/OFF Detection," and filed May 16, 2012, which claims priority to U.S. Provisional Application Ser. No. 61/600,894, entitled "Methods and Apparatus for Automatic TV ON/OFF Detection without Manual Calibration Using the Current or Power Draw of the TV," and filed on Feb. 20, 2012. U.S. patent application Ser. No. 13/473,320 and U.S. Provisional Application Ser. No. 61/600,894 are hereby incorporated herein by reference in their respective entireties.

FIELD OF THE DISCLOSURE

This disclosure relates generally to audience measurement and, more particularly, to methods and apparatus for automatic television ON/OFF detection.

BACKGROUND

Audience measurement of media, such as television and/or radio programs, is typically carried out by monitoring media exposure of panelists that are statistically selected to represent particular demographic groups. Audience measurement companies, such as The Nielsen Company (US), LLC, enroll households and persons to participate in measurement panels. By enrolling in these measurement panels, households and persons agree to allow the corresponding audience measurement company to monitor their exposure to information presentations, such as media output via a television, a radio, a computer, etc. Using various statistical methods, the collected media exposure data is processed to determine the size and/or demographic composition of the audience(s) for media program(s) of interest. The audience size and/or demographic information is valuable to, for example, advertisers, broadcasters, content providers, manufacturers, retailers, product developers, etc. For example, audience size and/or demographic information is a factor in the placement of advertisements, in valuing commercial time slots during particular programs and/or generating ratings for piece(s) of media.

BRIEF DESCRIPTION OF THE DRAWINGS

FIG. 5A illustrates a first example list generated by the example power logger of FIG. 4.

FIG. 5B illustrates a second example list generated by the example power logger of FIG. 4.

FIG. 7A illustrates an example comparison chart generated by the example chart generator of FIG. 6.

FIG. 7B illustrates an example power chart generated by the example chart generator of FIG. 6.

FIG. 8 illustrates an example chart used by the example OFF threshold calculator of FIG. 6.

FIG. 9 illustrates an example chart used by the example ON threshold calculator of FIG. 6.

DETAILED DESCRIPTION

Figure 1:
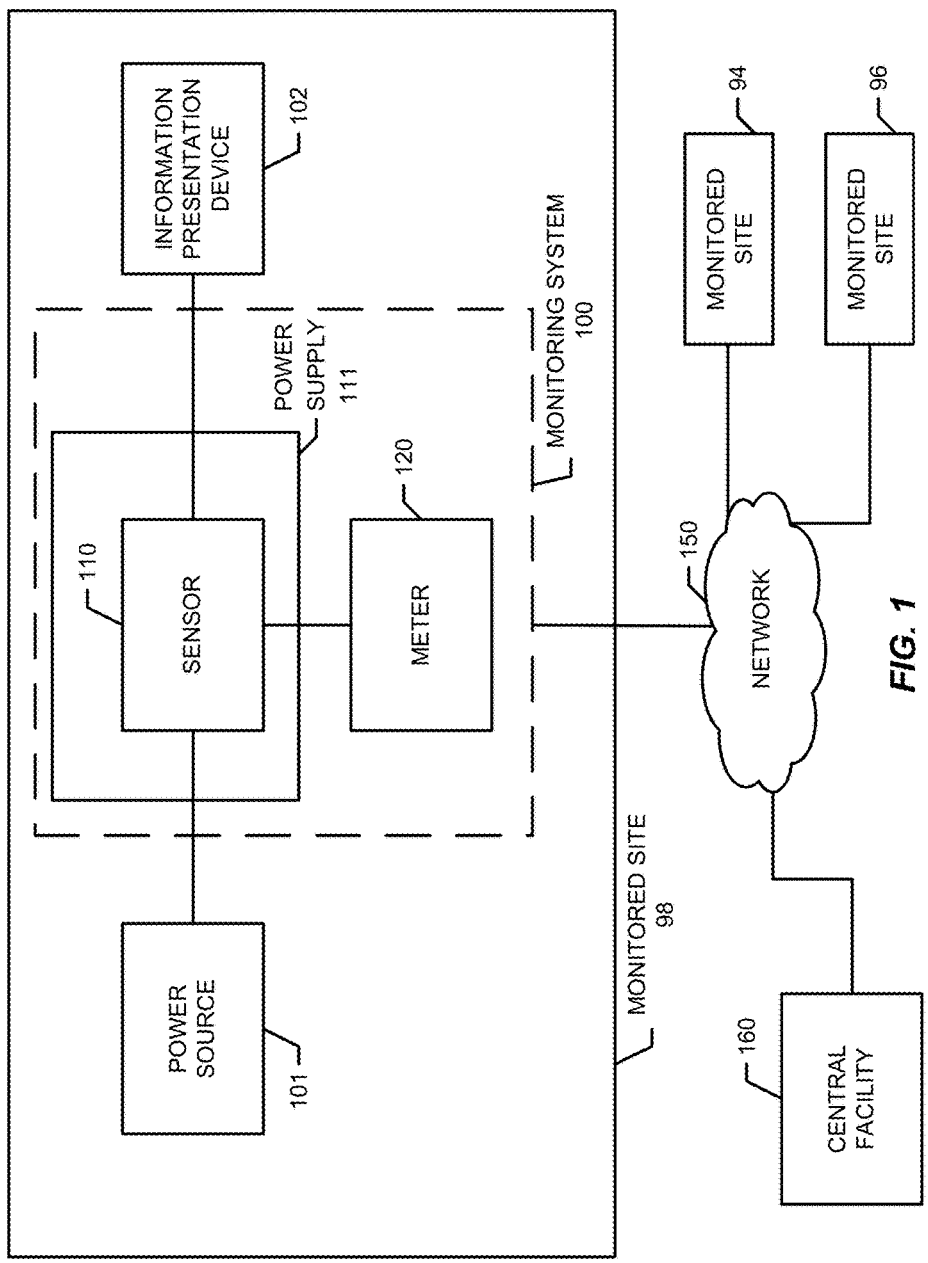
FIG. 1 is an illustration of an example system including an example monitoring system constructed in accordance with the teachings of this disclosure.

Television ON/OFF detection is useful in metering media exposure. For example, in the television monitoring context, the data collected via ON/OFF detection is used to calculate Households Using Television ("HUT") and People Using Television ("PUT") data. Knowing whether an information presentation device, such as a television (TV), is ON or OFF is useful for generating exposure statistics, such as HUT and PUT data, because media is often tuned through a device other than the presentation device (e.g., through a set-top box (STB)). In such instances, media may be tuned by the STB but not actually presented on an information presentation device because the information presentation device is turned OFF. Thus, crediting the tuned data as presented on the information presentation device (e.g., a TV, a radio, etc.) based solely on tuning information of the STB can result in inaccurate exposure data. Knowledge of the ON/OFF state of an information presentation device is also useful for conserving energy. For example, a meter tasked with monitoring a television can be powered down when the television is determined to be in an OFF state, thereby conserving energy when no valid and/or useful data (with respect to the meter) is available for collection.

An amount of consumed electrical current is sometimes used as an indicator for determining whether an information presentation device, such as a television, was in an ON state or an OFF state. For example, a current sensor (e.g., a Current Threshold Sensor Attachment ("CTSA"), CTSA2, or CTSA3) deployed in connection with a power apparatus (e.g., cord) of a television detects an amount of current drawn by the television from, for example, a power source such as a wall outlet. Such a current sensor is typically manually calibrated by, for example, a field representative associated with the corresponding meter. Calibrating the current sensor includes setting a threshold. The television is expected to draw current above the threshold when in an ON state, and to draw current below the threshold when in an OFF state. Thus, current readings taken by the sensor are compared to the threshold to determine whether the television is in an ON state or an OFF state A straightforward threshold setting (e.g., a single ON/OFF threshold) is practical when used in connection with, for example, cathode ray televisions ("CRTVs"), which have relatively few options for the state of the television. CRTVs generally have OFF, ON, and Input or Black Screen states. When in the ON state or the Input state, such televisions draw considerably more power (e.g., current and/or voltage) than when in the OFF state. Therefore, threshold calibration for CRTVs is relatively straightforward.

However, more advanced televisions (e.g., smart televisions) are more complex and operate in a greater number of states. For example, smart televisions include options such as Economy Mode, Picture Off, Fast versus Slow ON, 3D viewing, Internet streaming, ON, OFF, Input, Black Screen, etc. In some instances, televisions enter a hibernation state to conserve energy in which the television draws more power than when in the OFF state, but less power than when in the ON state. In some instances, Fast ON states, Fast OFF states, Slow OFF states, and Slow ON states cause the television to gradually transition from an ON state to an OFF state and vice-a-versa. Such televisions draw an intermediate amount of current during the transitions. Additional and/or alternative current draw scenarios and states are possible with present and future televisions.

The wide range of settings and options available on such televisions corresponds to a similarly wide range of possible power draws. The wide range of possible power draws for such a television makes automatic ON/OFF state detection less straightforward than with, for example, conventional CRTVs. For example, when a wide range of possible power draws exists, manual calibration process(es) are more time-consuming (e.g., require a field representative up to 10 hours to calibrate) and require complex calculations to set threshold(s). Further, more complex televisions (with respect to a number of possible power draw levels) give rise to the possibility of needing re-calibration if, for example, a setting is changed after an initial calibration (e.g., by a user and/or a member of a media exposure panel). For example, an initial calibration of a threshold may be based on the television being in a standard OFF state when not presenting media. However, a user may subsequently change a setting or mode of the television (e.g., a fast start mode) that causes the television to draw more power than the standard OFF state when not presenting media. In such instances, the initial calibration may lead to inaccurate readings, measurements and/or monitoring of media exposure.

Example methods, apparatus, and/or articles of manufacture disclosed herein enable accurate and sustainable ON/OFF detection for information presentation devices, such as televisions. Examples disclosed herein are particularly useful in connection with information presentation devices that operate in a plurality of different states and/or modes that cause the information presentation devices to draw different amount(s) of power.

Examples disclosed herein provide meters tasked with monitoring an information presentation device with multiple thresholds that are set according to an on-going calibration technique. As described in detail below, example calibration techniques disclosed herein include an initial calibration of thresholds upon, for example, installation of the corresponding meter. To enable the meter to adapt to changes associated with the information presentation device (e.g., changes in settings and/or modes of the television), example calibration techniques disclosed herein re-calibrate the meter at intervals (e.g., each day). Moreover, example calibration techniques disclosed herein enable meters to avoid basing a threshold calculation on outlier conditions and/or detections.

Further, example state detection techniques disclosed herein enable meters to detect a state of the corresponding information presentation devices using detected power when the information presentation devices have wide and/or complex ranges of power characteristics. In other words, examples disclosed herein enable meters to accurately determine a state of an information presentation device that operates in a wide variety of states. As described in greater detail below, examples disclosed herein analyze current and previously detected power states of an information presentation device to identify states of the information presentation devices.

FIG. 1 illustrates an example monitoring system 100 constructed in accordance with teachings of the present disclosure to monitor a state of an information presentation device 102. In the illustrated example, the information presentation device 102 is a television implemented at a monitored site (e.g., a household), such as any of the monitored sites 94-98. However, the example monitoring system 100 can be implemented in connection with additional and/or alternative types of information presentation device(s) operating in a plurality of states. The example information presentation device 102 of FIG. 1 is powered by a power source 101 (e.g., a wall outlet or any other type of commercial power) via a power supply 111. The example monitoring system 100 of FIG. 1 is in communication with a central facility 160 via a network 150.

The example network 150 of FIG. 1 communicates data from the monitored site 98 to the example central facility 160 and/or a remote storage location associated with the central facility 160. The example network 150 may be implemented using any type of public and/or private network such as, for example, the Internet, a telephone network (e.g., the Plain Old Telephone System), a cellular network, a local area network ("LAN"), a cable network and/or a wireless network.

The example central facility 160 of the illustrated example collects and/or stores, for example, television ON and OFF determinations, media exposure data, media monitoring data and/or demographic information collected by monitoring systems, such as the example monitoring system 100 of FIG. 1, associated with respective ones of a plurality of monitored sites (e.g., multiple panelist houses). The example central facility 160 may be, for example, a facility associated with The Nielsen Company (US), LLC or any affiliate of The Nielsen Company (US), LLC. The example central facility 160 of FIG. 1 includes a server and a database which may be implemented using any suitable processor, memory and/or data storage such as, for example, the processor platform 1612 shown in FIG. 16.

The example monitoring system 100 of FIG. 1 includes a meter 120 and a sensor 110 implemented in connection with the example power supply 111. In the example of FIG. 1, the power supply 111 is coupled to the power source 101 via, for example, a three pronged power plug. The information presentation device 102 is coupled to the example power supply 111 via any suitable connector such as, for example, a three pronged power plug. The example power supply 111 transfers power from the power source 101 to the information presentation device 102 in accordance with the power demand of the information presentation device 102. As described in greater detail below, the example information presentation device 102 of FIG. 1 is capable of being in any of a plurality of states. The information presentation device 102 draws different amounts of power from the power source 101 via the power supply 111 depending on which one of the states the information presentation device 102 is operating.

The example sensor 110 of FIG. 1 monitors (e.g., senses) the amount of power drawn from the power source 101 by the example information presentation device 102 via the power supply 111. The example sensor 110 of FIG. 1 monitors an amount of current drawn by the information presentation device 102. However, additional and/or alternative measurements can be utilized by the example sensor 110 of FIG. 1. For example, the sensor 110 can measure a current and/or a combination of current and voltage to determine an amount of power being drawn by the information presentation device 102. The example sensor 110 measures the power drawn by the information presentation device 102 without disturbing operation of the example information presentation device 102.

In the example of FIG. 1, an output from the sensor 110 is communicated to the example meter 120. The example sensor 110 of FIG. 1 is in communication with the example meter 120 via, for example, a Universal Serial Bus (USB) cable and/or any other suitable type of connector. In some examples, the sensor 110 and meter 120 are additionally or alternatively placed in communication wirelessly (e.g., via Wi-Fi, Bluetooth, etc.). In the illustrated example, the sensor 110 communicates a value representative of a power level drawn by the information presentation device 102. As described below in connection with FIG. 2, the example sensor 110 outputs a digital number converted from an analog signal which corresponds to (e.g., is representative of, is proportional to, etc.) the wattage or power level drawn by the example information presentation device 102. The digital number output from the example sensor 110 of FIG. 1 is communicated to the example meter 120 via, for example, USB protocol. However, any other past, present, or future wired or wireless communication protocol may alternatively be employed.

In the illustrated example, the example meter 120 utilizes the received output from the example sensor 110 to calibrate one or more thresholds and to determine a present power state (e.g. ON or OFF) of the information presentation device based on the threshold(s). In some examples, the meter 120 processes the power state determination locally (e.g., via a processor such as the processor 1612 of FIG. 16 carried by the meter 120). In other examples, the meter 120 transfers the data on which the determination is based to the example central facility 160 (e.g., via the example network 150) for processing.

As described in detail below in connection with FIGS. 3-9 and 12-15, the threshold(s) on which the example meter 120 bases the state determinations are calculated by the example meter 120 of FIG. 1 based on learned behavior of the information presentation device 102. In particular, the example meter 120 of FIG. 1 logs outputs from the example sensor 110 during an initial calibration period to identify a power draw of the example information presentation device 102 while the information presentation device is in the OFF state. An initial set of thresholds (e.g., an OFF threshold and an ON threshold) is then generated based on the identified power draw. Further, the example meter 120 of FIG. 1 repeatedly recalibrates the thresholds based on continued measurements taken by the sensor 110 and one or more assumptions described in detail below.

Figure 2:
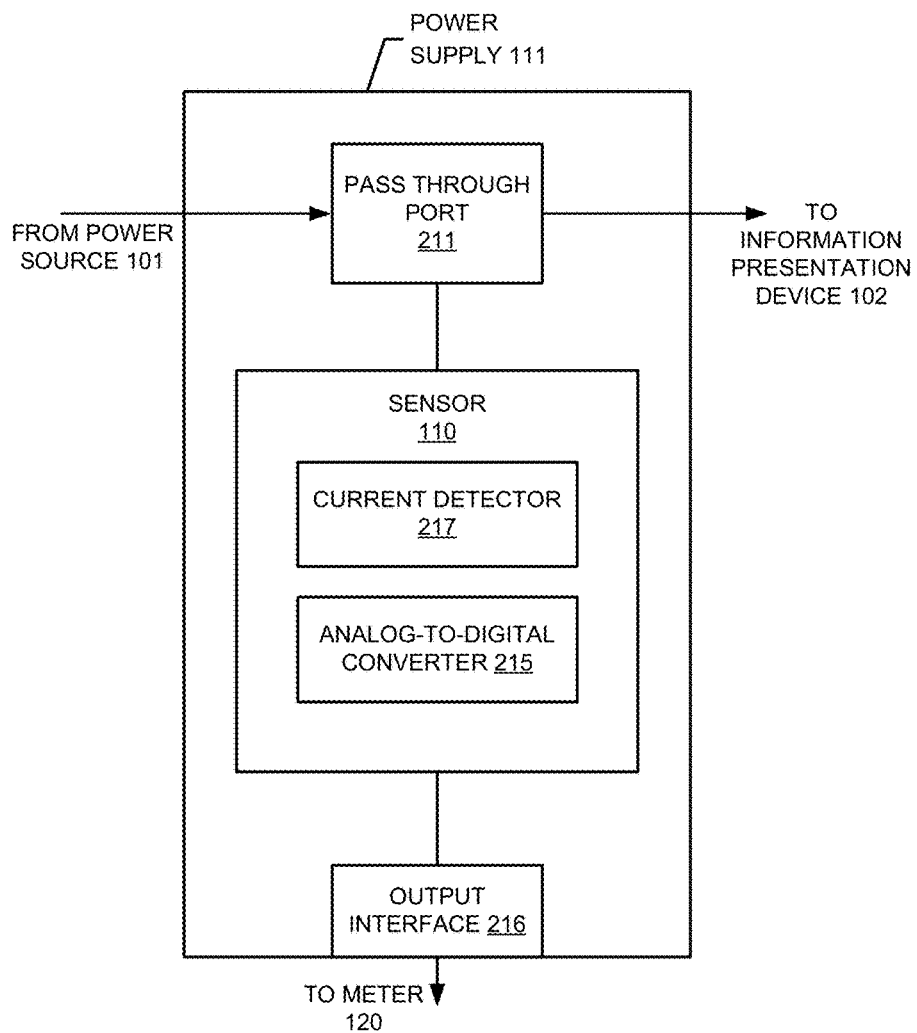
FIG. 2 is a block diagram of an example implementation of the example power supply of FIG. 1.

FIG. 2 is a block diagram of an example implementation of the example power supply 111 of FIG. 1. In the illustrated example, the sensor 110 is used to measure the power (e.g., current and/or voltage) drawn by the example information presentation device 102 of FIG. 1. The sensor 110 of the illustrated example monitors the power drawn by the example information presentation device 102 from the example power source 101 and outputs a corresponding value to the example meter 120. To do so, the example power supply 111 includes a pass through port 211, an output interface 216, and the sensor 110. In the illustrated example, the sensor 110 includes a current detector 217 and an analog-to-digital converter 215.

The example pass through port 211 of FIG. 2 receives current (e.g., AC current) from the power source 101 and provides the current to the example information presentation device 102 of FIG. 1. In some examples, the power supply 111 includes a filter to eliminate noise from the output of the sensor 110. The current passing through the example pass through port 211 of FIG. 2 is monitored by the example current detector 217. The example current detector 217 may be any type of sensor able to measure the current drawn by the information presentation device 102 (e.g., a Hall Effect Sensor).

In the illustrated example, the current detector 217 conveys a reading and/or measurement to the example analog-to-digital converter 215. The example analog-to-digital converter 215 outputs a digital voltage proportional to the analog voltage received from the example sensor 110. In the example of FIG. 2, the analog-to-digital converter 215 includes a PIC 18 microprocessor. The example analog-to-digital converter 215 translates the voltage received from the example current detector 217 into a digital value. The reading and/or measurement taken by the example sensor 110 is then output to the example meter 120 via the output interface 216 (e.g., a USB port). The data is communicated to the meter 120 periodically (e.g., in response to a clock), aperiodically (e.g., in response to one or more events or conditions) and/or continuously. In some examples, the output of the sensor 110 is stored in local memory in addition to and/or prior to outputting the value to the meter 120. In some examples, this digital value is 12-bits long (e.g., to provide representation for a range between 0 and 4095).

Thus, the digital value output by the example sensor 110 of the illustrated example is representative of (e.g., proportional to) the current drawn by the monitored information presentation device 102. In some examples, the digital value has no units but is interpreted as a representation of the average current drawn by the monitored information presentation device 102 from the power source 101 (e.g., in Amps). As the output of the example sensor 110 of FIG. 2 corresponds to the current, and power is proportional to current (P=I*V), the output of the sensor 110 likewise corresponds (e.g., is proportional) to the wattage drawn by the monitored information presentation device 102. Therefore, the output of the example sensor 110 may be referred to as a power reference or value (e.g., wattage).

While an example manner of implementing the power supply 111 of FIG. 1 has been illustrated in FIG. 2, one or more of the elements, processes, and/or devices illustrated in FIG. 2 may be combined, divided, re-arranged, omitted, and/or implemented in any other way. Further, the example current detector 217, the example analog-to-digital converter 215 and/or, more generally, the example sensor 110 of FIG. 2 may be implemented by hardware, software, firmware and/or any combination of hardware, software and/or firmware. Thus, for example, any of the example current detector 217, the example analog-to-digital converter 215 and/or, more generally, the example sensor 110 of FIG. 2 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example current detector 217, the example analog-to-digital converter 215 and/or the sensor 110 are hereby expressly defined to include a tangible computer readable storage medium such as a memory, DVD, CD, Blu-ray, etc. storing the software and/or firmware. Further still, the example power supply 111 of FIG. 2 may include one or more elements, processes and/or devices in addition to, or instead of, those illustrated in FIG. 2, and/or may include more than one of any or all of the illustrated elements, processes and devices.

Figure 3:
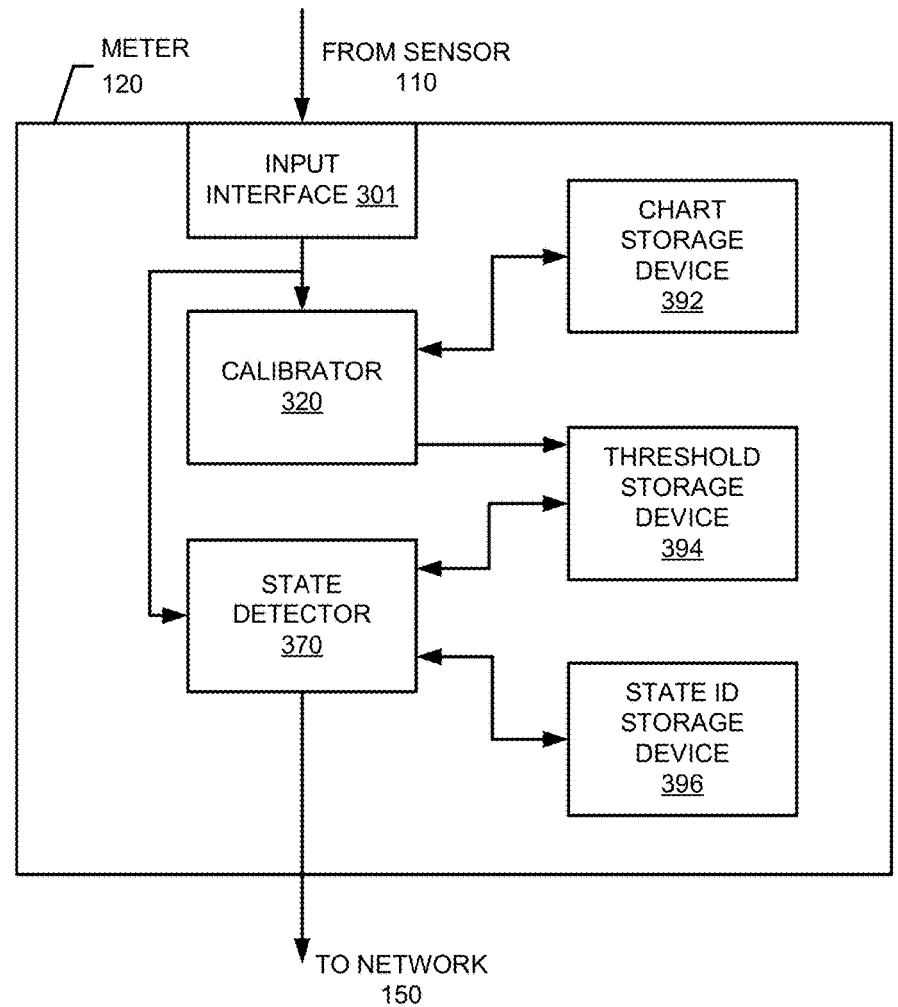
FIG. 3 is a block diagram of a first example implementation of the example meter of FIG. 1.

FIG. 3 illustrates an example implementation of the example meter 120 of FIG. 1. In the illustrated example, the meter 120 is used to determine the power state (e.g., ON, OFF) of an information presentation device such as, for example, the example information presentation device 102 of FIG. 1. As described above, the state of the information presentation device 102 is used (e.g., by an audience measurement entity) to generate statistics related to media exposure at, for example, the monitored sites 94-98. The example meter 120 of FIG. 3 receives a power measurement (e.g., a digital value representative of a power level) from the sensor 110 of FIGS. 1 and/or 2 via an input interface 301. The example input interface 301 of FIG. 3 is implemented by a USB port. However, the example meter 120 can utilize any suitable interface. The input interface 301 transmits the received power measurement to a calibrator 320 and a state detector 370. The example state detector 370 of FIG. 3 determines the state of the information presentation device 102 (e.g., ON, OFF) based on a plurality of thresholds generated by the calibrator 320 of the example meter 120. As described in detail below in connection with FIG. 4, the example calibrator 320 repeatedly (e.g., periodically, aperiodically, according to a schedule, etc.) calibrates the meter 120 by identifying and/or adjusting the thresholds on which the state determinations of the example state detector 370 are based. To calculate and/or adjust the thresholds, the example calibrator 320 generates a power chart using the values received from the sensor 110 of FIGS. 1 and/or 2. In the example of FIG. 3, the calibrator 320 stores the power chart in a chart storage device 392. Further, the thresholds generated by the calibrator 320 using the generated chart of the chart storage device 392 are stored in a threshold storage device 394. Generation of the power charts and the thresholds are described in detail below in connection with FIGS. 4-9.

The example state detector 370 compares the received current measurement, which is representative of an amount of power currently drawn by the information presentation device 102, to the thresholds generated by the calibrator 320 to identify a state of the information presentation device 102. As the example state detector 370 determines the state of the information presentation device 102, the example state detector 370 records the state determinations in a state ID storage device 396. The data of the state ID storage device 396 is transmitted (e.g., periodically, aperiodically, according to a schedule, etc.) to the example central facility 160 of FIG. 1. Additionally and/or alternatively, the example state detector 370 conveys the detected states directly to the central facility 160 (e.g., without being stored in the local state ID storage device 396). The state determinations of the example state detector 370 are described below in connection with FIGS. 10 and 11.

The example calibrator 320 and the example state detector 370 of FIG. 3 cooperate to enable the meter 120 to determine whether, for example, the information presentation device 102 is ON or OFF at a given time or for a given period of time based on repeatedly and automatically calibrated thresholds.

Figure 4:
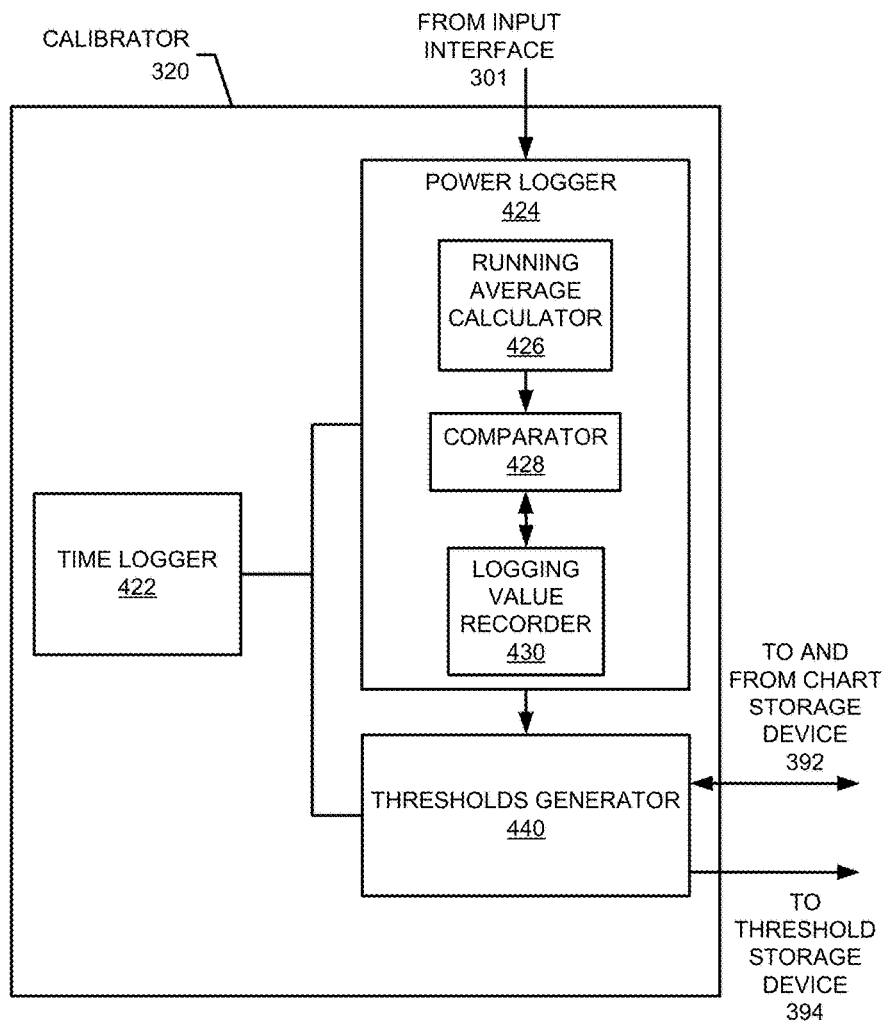
FIG. 4 is a block diagram of an example implementation of the example calibrator of FIG. 3.

FIG. 4 illustrates an example implementation of the example calibrator 320 of FIG. 3. In the illustrated example of FIG. 4, the calibrator 320 includes a power logger 424, a thresholds generator 440 and a time logger 422. The example time logger 422 maintains timing information to control different calibration modes of the example calibrator 320. For example, the calibrator 320 of FIG. 4 includes a learning mode and a recalibration mode. When the example calibrator 320 of FIG. 4 is in learning mode, the duration of the corresponding calibration period is a relatively short period of time (e.g., five minutes). In the illustrated example, the learning mode corresponds to an initial period of calibration that occurs when, for example, the meter 120 is first installed at the monitored site 98 of FIG. 1. In some examples, the meter 120 enters the learning mode when, for example, the meter 120 is first installed, is reset and/or is undergoing an update (e.g., a software update). The recalibration mode has a longer duration than the learning mode. For example, while the learning mode of the illustrated example lasts for five minutes, the recalibration mode may be of any other duration, (e.g., twenty-four hours). As described below, the recalibration mode enables the meter 120 to continue to base its determination on accurate thresholds by avoiding scenarios in which changes in the operation and/or mode of the television skew the results of the comparison performed by the state detector 370. The example time logger 422 of FIG. 4 stores the calibration period duration value and determines when instances of, for example, the recalibration mode have ended (e.g., to indicate that a new period can begin). The example time logger 422 communicates an indicator indicative of an expiration of a calibration period to the example thresholds generator 440 to trigger a calculation of the thresholds.

To determine whether the calibrator 320 of FIG. 4 should be in the learning mode or the recalibration mode, the example time logger 422 checks the example threshold storage device 394 of FIG. 3 to determine if thresholds have already been generated. When thresholds are not detected in the example threshold storage device 394 of FIG. 3, the example time logger 422 of FIG. 4 operates in the learning mode. When thresholds are detected in the example threshold storage device 394 of FIG. 3, the example time logger 422 of FIG. 4 operates in the recalibration mode.

The learning mode of the example calibrator 320 of FIG. 4 enables simple and efficient installations of the meter 120 into a monitored site 98. As described above, when the example calibrator 320 is in learning mode, the calibration period is a relatively short period of time, such as five minutes. As a result, a field representative installing the meter 120 can utilize the learning mode to quickly determine whether the example meter 120 of FIG. 1 is operating properly. In the illustrated example, the meter 120 is calibrated by placing the information presentation device 102 in an OFF state and measuring the power drawn by the information presentation device 102 via the sensor 110. The measured amount of power drawn when the information presentation device 102 is in the OFF state is used as an OFF threshold for the learning mode. Thus, the learning mode of the calibrator 320 results in an OFF threshold based on the standard OFF state of the information presentation device 102. In the illustrated example, the ON threshold is calculated as a multiple of the OFF threshold because the information presentation device 102 was not placed in an ON state during the calibration period. However, it is also possible to calculate an OFF threshold and an ON threshold during the learning mode by switching the information presentation device 102 from an OFF state to an ON state, or vice versa. Additionally and/or alternatively, predetermined ON and OFF thresholds based on the monitored information presentation device 102 may be used. For example, during the learning mode, the calibrator 320 may calculate the ON and OFF thresholds based on characteristics (e.g., display size, type (e.g., LED, plasma, etc.), model, brand, etc.) of the information presentation device 102 identified by the user or field representative. In such instances, the identified characteristics can be used to lookup (e.g., in a database or chart) corresponding ON/OFF threshold information. In some examples, the calibrator 320 retrieves the predetermined ON and OFF thresholds from the example central facility 160 of FIG. 1. In some examples, the calibrator 320 stores predetermined ON and OFF thresholds in a local memory or register.

The recalibration mode allows automatic updates of the thresholds used to determine the state of the information presentation device 102 after the learning mode over a longer period of time, such as every twenty-four hours. The example information presentation device 102 enables users to change one or more power settings such that the information presentation device 102 powers down and/or up using different amounts of power than during standard ON/OFF conditions. When a user changes such setting(s) of the information presentation device 102, the power drawn by the information presentation device 102 while OFF also changes. For example, enabling a Fast Start mode of the information presentation device 102 causes the information presentation device 102 to remain in a standby state when instructed to power down (e.g., via an OFF button of an input device (e.g., remote control) associated with the information presentation device 102) such that not all components of the information presentation device 102 are fully powered down. Such a mode enables a faster startup time for the information presentation device 102 because some components are already at least partially powered when the user instructs the information presentation device 102 to power up (e.g., via a remote control). Utilizing additional or alternative types of modes can change the amount of power drawn by the information presentation device 102 while in an OFF state or an ON state.

If the user enables a mode that changes the amount of power drawn when the information presentation device 102 is not presenting media to the user after the initial learning mode of the meter 120 is performed, the thresholds generated by the calibrator 320 during the learning mode may lead to inaccurate state determinations by the state detector 370. That is, because certain user-enabled modes of the information presentation device 102 can increase or decrease the power draw of an information presentation device 102 in the OFF state, state determinations based on thresholds generated during the learning mode would be incorrect. The example calibrator 320 of FIG. 4 addresses this problem using the recalibration mode, which automatically adapts to such operating mode changes (e.g., activation of a Fast Start mode) by generating new thresholds representative of the currently enabled power mode(s) of the information presentation device. By automatically recalibrating (e.g., updating) the generated thresholds at defined intervals (e.g., every twenty-four hours) and/or by being responsive to enablement/disablement of operating modes by a user, the thresholds used by the example state detector 370 of FIG. 3 reflect up-to-date power settings and/or modes of the information presentation device 102 and, thus, facilitate accurate state detection of the information presentation device 102.

To generate the updated thresholds, the example power logger 424 repeatedly (e.g., continuously, aperiodically or periodically (e.g., every second)) receives power measurements from the example sensor 110 of the example power supply 111 of FIG. 2. As a result, power measurements, including power measurements sensed during state transitions, are received. To address power measurements not representative of defined power states (e.g., power measurements sensed during state transitions, during fluctuations in the commercial power supply (e.g., power surges at the power source 101 of FIG. 1 during a storm), etc.), the example power logger 424 creates a log of stable power measurements based on a comparison of received power measurements and a running average of received power measurements. In some examples, a thirty second running average of power measurements is compared with the received power measurements before logging a power measurement. However, alternate averages over other periods of time are possible. The comparisons (which are described in detail below) of the received power measurements to the running average before logging the measurements enable the logged power measurements to represent stable power levels (e.g., power levels representative of different identifiable power states). Additionally, the comparisons to the running average utilized by the example power logger 424 prevent fluctuations in the commercial power supply (e.g., power surges at the power source 101 of FIG. 1 during a storm) sensed by the example sensor 110 of FIG. 2 from skewing the logged power measurements used by the example thresholds generator 440 when generating thresholds.

The example running average calculator 426 of the example power logger 424 of FIG. 4 calculates a running average of power measurements received from the example sensor 110 of FIG. 2. In the illustrated example of FIG. 4, the running average calculator 426 receives a power measurement every second and calculates a running average over a period of time and/or number of readings such as, for example, thirty seconds and/or thirty readings. Thus, the example running average calculator 426 of FIG. 4 averages the previous thirty power measurements to generate the current value of the running average.

In the illustrated example, the power logger 424 of FIG. 4 includes a comparator 428, which compares the running average of received power measurements with a newly received power measurement before triggering the logging value recorder 430 to log a power measurement. When the received power measurement differs from the current value of the running average by a threshold amount (e.g., a minimum percentage such as twenty percent), the example power logger 424 of FIG. 4 discards the power measurement received from the sensor 110. When the received power measurement is discarded, the example logging value recorder 430 of FIG. 4 logs the previously logged power measurement (e.g., the last power measurement that did not differ from the corresponding value of the running average by the threshold amount). In other words, in lieu of logging the current measurement, the example logging value recorder 430 re-logs the most recent previous power measurement. On the other hand, when the received power measurement is within the threshold amount (e.g., plus or minus twenty percent) of the current value of the running average, the example logging value recorder 430 logs the newly received power measurement. As a result, the values logged by the example logging value recorder 430 of FIG. 4 represent stable power measurements. When stable power measurements are logged, fluctuations in power (e.g., a power surge) that are not representative of state changes by the monitored information presentation device 102 are eliminated and, thus, not logged as power states. Instead, sensed power levels of similar values (e.g., within the threshold) are grouped into separately identified states. Because stable power measurements are logged and used as a basis to generate the ON and OFF thresholds, accurate ON and OFF state power measurements are identified by the example thresholds generator 440 of FIG. 4.

FIG. 5A is an example list 500 representative of values generated by the example power logger 424 of FIG. 4. The example list 500 of FIG. 5A includes power measurements 502 received from the sensor 110 of FIGS. 1 and/or 2 and a running average value 504 calculated by the example running average calculator 426 of FIG. 4. To generate the example running average 504 of FIG. 5A, the example running average calculator 426 uses a five second period (e.g., the previous five power measurements that are received every second) when calculating the average and rounds each calculated value to the nearest whole number. Alternative periods of time may be used.

Referring to a first example point 508 in the list 500, in this example, it is assumed the example power logger 424 of FIG. 4 receives a power measurement of twenty (e.g., Watts) from the example sensor 110 of FIG. 2. Further, the example running average calculator 426 of FIG. 4 calculates an average value for the previous five seconds. At the first example point 508 in the example list 500, the example running average calculator 426 of FIG. 4 sums the power measurements for the previous five second period (e.g., 20+15+8+3+3=49) and divides the resulting sum by the number of summed measurements, which in this case is five. At the first example point 508 in the list 500 of FIG. 5A, the resulting value of the running average is 9.8 (e.g., 49/5), which is rounded to the nearest whole number, which is ten.

The example comparator 428 of FIG. 4 compares the power measurement 502 received from the sensor 110 of FIG. 2 and the corresponding running average value 504 generated by the example running average calculator 426 (e.g., by computing the difference between the running average value 504 and the power measurement 502). The example comparator 428 of FIG. 4 then compares the difference between the power measurement 502 and the corresponding running average value 504 to the threshold amount. In the illustrated example of FIG. 5A, the threshold is twenty percent. In other words, the example comparator 428 of FIG. 4 determines whether the power measurement 502 is greater than or less than the corresponding running average value 504 by twenty percent. For instance, at the first example point 508 in the list 500, the example comparator 428 compares a power measurement value of twenty (20) and a corresponding running average value of ten (10). In this example, twenty percent of the running average value is two (2) and, thus, the acceptable power range (e.g., within the threshold amount) is from eight (8) to twelve (12) (e.g., plus or minus twenty percent of the running average value). At the first example point 508 of the list 500, the example comparator 428 determines that the power measurement (e.g., twenty) does not fall within the acceptable difference range (e.g., eight to twelve) and, thus, outputs an appropriate negative indication (e.g., no, 0, false, null, etc.) to the example logging value recorder 430 of the example power logger 424 of FIG. 4. When the example comparator 428 of the example power logger 424 of FIG. 4 determines that the power measurement falls within the acceptable difference range, the example comparator 428 outputs a positive indication (e.g., yes, 1, true, etc.) to the example logging value recorder 430. Although the above example mentions one comparator 428, the example comparator 428 performs two comparisons and, thus, may include two or more comparators. For example, a first comparator may compare the received power measurement to the lesser value of the acceptable range (e.g., eight) and a second comparator may compare the received power measurement to the greater value of the acceptable range (e.g., twelve).

The example logging value recorder 430 of the example power logger 424 of FIG. 4 receives the power measurement from the example sensor 110 of FIGS. 1 and/or 2 and the indication output from the example comparator 428. When the example logging value recorder 430 of FIG. 4 receives a positive indication (e.g., representation that the power measurement is within the acceptable difference range) in connection with a power measurement value from the comparator 428, the example logging value recorder 430 of FIG. 4 logs the value of the received power measurement (e.g., in the logged value portion 506 of the example list 500 of FIG. 5A). When the example logging value recorder 430 receives a negative indication (e.g., power measurement is not within the acceptable difference range) in connection with a power measurement value from the comparator 428, the example logging value recorder 430 logs the previously logged power measurement. As shown in the example list 500 of FIG. 5A, a previous power measurement value (three) is logged at the first example point 508. Because the value of twenty (20) is outside the acceptable range of eight (8) to twelve (12) for the first point 508 in the list 500, the example logging value recorder 430 receives the power measurement of twenty (20) and a negative indication from the example comparator 428. As a result, the example logging value recorder 430 discards the received power measurement and logs the previous power measurement (e.g., three) in the logged value portion 506 of the list 500. Rather than logging the transition power measurements received during the transition (e.g., twenty), the logged power measurement (e.g., three) represents a stable power measurement. As shown in the example list 500 of FIG. 5A, a current power measurement value (thirty) is logged at the second example point 509. Because the value of thirty (30) is within the acceptable range of twenty-one (21) to thirty-one (31) for the second point 509 in the list 500 (e.g., plus or minus twenty percent of the running average value (26), the example logging value recorder 430 receives the power measurement of thirty (30) and a positive indication from the example comparator 428. As a result, the example logging value recorder 430 logs the current power measurement value (e.g., 30) in the logged value portion 506 of the list 500.

An example benefit of logging values based on received power measurements and running averages includes preventing power measurements very close to each other (e.g., 41, 42, 43) from each being logged as independent power states. Another example benefit includes eliminating logging (and, thus, basing the thresholds on) power measurements due to fluctuations (e.g., power surges, etc.) in the power drawn by the example information presentation device 102.

The example power logger 424 can utilize additional and/or alternative techniques to generate a list of logged values. FIG. 5B is an example list 550 generated in accordance with an example alternative to the technique described above in connection with FIG. 5A.

Similar to the example list 500 of FIG. 5A, the example list 550 of FIG. 5B includes power measurements 510, running average values 512 calculated by the example running average calculator 426 and logged values 552. The running average value 512 of the example list 550 of FIG. 5B is calculated similar to the running average value 504 of the example list 500 of FIG. 5A and uses a five second period time. As the values of the power measurements 510 of FIG. 5B are the same as the power measurements 502 of FIG. 5A and the running average is calculated in FIG. 5B in the same manner as in FIG. 5A, the power measurement values (502, 510) and the running average values (504, 512) are the same across FIGS. 5A and 5B.

To generate the example list 550 of FIG. 5B, the logging value recorder 430 maintains a flag 560 that establishes a requisite number of indications of a power transitions before the logged value 552 can be changed from a previous value. As described below, when a requisite number of transition indications (e.g., running average values differing from previously logged values by at least a threshold amount have occurred, the flag is set to enable a new value to be logged rather than logging the same value from a previous iteration. By utilizing a flag to determine whether to log a new value (e.g., the current running average value 512) or the previously logged value 552, the example power logger 424 minimizes logging values due to short-term deviations in running average values 512. For example, large changes (e.g., greater than the threshold amount) in the running average values 512 due to fluctuations in the commercial power supply (e.g., power surges at the example power source 101 during a storm) or while transitioning between power states (e.g., transitioning from the OFF power state to the ON power state) are not logged by the example power logger 424. As a result, the example power logger 424 creates a log of stable values representative of power measurements sensed by the example sensor 110 of FIGS. 1 and/or 2. Although the following describes a one (1) count requisite number of consecutive number of positive indications to set the flag 560 (e.g., set to one), any number of consecutive number of positive indications may be used to set the flag 560. For example, a five (5) count may require the example logging value recorder 430 to receive five (5) consecutive positive indications from the example comparator 428 to set the flat 560 (e.g., set to one).

While the example list 500 of FIG. 5A is generated via comparing the power measurement values 502 to the corresponding running average values 504, the example power logger 424 of FIG. 4 utilizes comparison(s) of running average values 512 to previously logged values 552 to generate the list 550 of FIG. 5B. As described in detail below, for a currently received power measurement, the corresponding running average value is computed and compared to the prior entry in the logged value portion 552 of the list 550. In particular, the example comparator 428 of FIG. 4 compares the running average value 512 and the previously logged value 552 by computing their difference. The example comparator 428 of FIG. 4 compares the computed difference to a threshold amount. In the illustrated example of FIG. 5B, the example threshold amount is plus or minus twenty percent. In other words, the example comparator 428 of FIG. 4 determines whether the running average value 512 is greater than (or equal to) or less than (or equal to) the previously logged value 552 by twenty percent.

Referring to a first example point 556 in the list 550, the example running average calculator 426 calculates a running average value of four (4). The example comparator 428 compares the running average value 512 at the first example point 556 (e.g., four) to the previously logged value 552 (e.g., three), which corresponds to a second example point 558 in the list 550 occurring immediately prior to the first point 556. At the first example point 556 of the list 550, the example comparator 428 determines the running average value (four) falls outside the threshold amount of difference (e.g., plus or minus twenty percent) from the previously logged value (three). As a result, the comparator 428 outputs a positive indication (e.g., yes, 1, true, etc.) to the example logging value recorder 430. On the other hand, when the example comparator 428 of the example power logger 424 of FIG. 4 determines the running average value 512 falls within the threshold amount (e.g., differs from the previously logged value 552 by less than twenty percent), the example comparator 428 outputs a negative indication (e.g., no, 0, false, null, etc.) to the example logging value recorder 430 of the example power logger 424 of FIG. 4.

The example logging value recorder 430 of the example power logger 424 of FIG. 4 receives the running average value 512 from the example running average calculator 426 and the indication (e.g., positive or negative) from the example comparator 428. The example logging value recorder 430 also maintains a flag 560. In the illustrated example of FIG. 5B, the state of the flag 560 indicates whether the example logging value recorder 430 is to log the previously logged value or the running average value. When the flag 560 is set (e.g., set to one), the example logging value recorder 430 has received a requisite number of consecutive positive indications from the example comparator 428 and stores the running average value. Otherwise, the example logging value recorder 430 discards the received running average value and logs the previously logged value. In the illustrated example of FIG. 5B, the requisite number of positive indications to set the flag is one (1). In other words, when the running average value is logged by the example logging value recorder 430, the difference between the running average value and the previously logged value has been greater than the threshold amount for two consecutive counts (e.g., one count to set the flag 560 and a second count to log the running average value). For example, when a monitored information presentation device 102 is transitioning from the OFF power state to the ON power state, a sufficiently large deviation (e.g., greater than the threshold amount) in the running average values 512 results in consecutive positive indications from the comparator 428. As a result, the example logging value recorder 430 logs the running average value. In addition to logging the running average value 512, the example logging value recorder 430 resets the flag 560 (e.g., set to zero) and, in effect, resets the count of consecutive positive indications received from the example comparator 428 to zero.

On the other hand, when the flag 560 is not set (e.g., the flag is set at zero), the example logging value recorder 430 has not received the requisite number of consecutive positive indications (e.g., one) to set the flag 560 (e.g., to one). As a result, the example logging value recorder 430 logs the previously logged value instead of the running average value. In the illustrated example, depending on the indication received from the example comparator 428, the example logging value recorder 430 may set the status of the flag 560 (e.g., to one) or may reset the status of the flag 560 (e.g., to zero) after logging the previously logged value.

By way of example, at the second example point 558 of FIG. 5B, the difference between the running average value 512 (e.g., three) and the previously logged value 552 (e.g., three) is less than the threshold amount (e.g., twenty percent) and the example comparator 428 outputs a negative indication. As a result, the example logging value recorder 430 logs the previously logged value (e.g., three) instead of the running average value at the second example point 558. Additionally, because of the received negative indication, the status of the flag 560 at the second example point 558 is reset (e.g., set to zero) by the example logging value recorder 430. At the next received power measurement 510 from the example sensor 110 of FIGS. 1 and/or 2 (e.g., the first example point 556), the example comparator 428 outputs a positive indication (e.g., the difference between the running average value 512 (e.g., four) and the previously logged value 552 (e.g., three) is greater than or equal to the threshold amount (e.g., twenty percent)). Because the status of the flag 560 at the second example point 558 was reset (e.g., set to zero), the example logging value recorder 430 logs the previously logged value (e.g., three) instead of the running average value at the first example point 556. In addition to logging the previously logged value, the example logging value recorder 430 sets the status of the flag 560 (e.g., set to one) because the requisite number of consecutive positive indications to set the flag 560 (e.g., one) was met. At the next calculated running average value 512 (e.g., the third example point 562), the example comparator 428 outputs a positive indication to the example logging value recorder 430 (e.g., the difference between the running average value 512 (e.g., six) and the previously logged value (e.g., three) is greater than or equal to the threshold amount (e.g., twenty percent)). As the status of the flag 560 at the previous point (e.g., the first example point 556) was previously set (e.g., set to one), the example logging value recorder 430 logs the received running average value (e.g., six) and resets the status of the flag 560 (e.g., set to zero).

The example thresholds generator 440 of FIG. 4 uses the stable logged power measurements 506 of the list 500 of FIG. 5A generated by the example power logger 424 to generate thresholds to be used by the example state detector 370 of FIG. 3. As described in detail below, when the sensed power measurements from the example sensor 110 of FIG. 1 are compared with the generated thresholds, the example state detector 370 of FIG. 3 detects the state of the example information presentation device 102. To identify the thresholds (e.g., during the learning mode) and/or adjust the thresholds (e.g., during the recalibration mode), the example thresholds generator 440 creates a power chart based on a plurality of power measurements 506 (FIG. 5A) logged by the example power logger 424 of FIG. 4. Using the generated power chart, the example thresholds generator 440 identifies an OFF state power measurement (e.g., the power drawn by the monitored information presentation device 102 while in the OFF state). Depending on the mode of the example calibrator 320 of FIG. 3 (e.g., learning mode, recalibration mode), the example thresholds generator 440 of FIG. 4 calculates the ON state power measurement differently. Based on the identified state power measurements (e.g., ON, OFF), the example thresholds generator 440 of FIG. 4 calculates an ON and OFF threshold.

Figure 6:
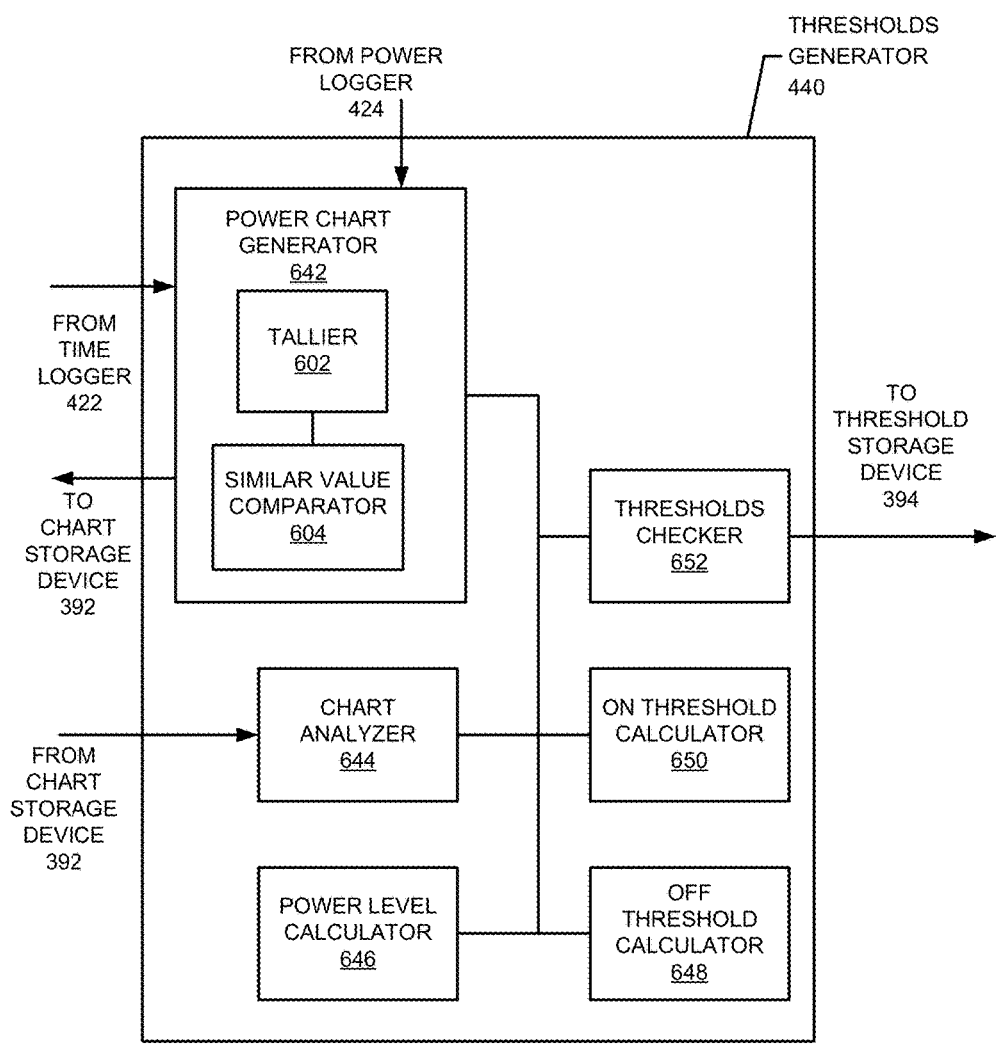
FIG. 6 is a block diagram of an example implementation of the example thresholds generator of FIG. 4.

FIG. 6 is an example implementation of the example thresholds generator 440 of FIG. 4. In the illustrated example of FIG. 6, the thresholds generator 440 of FIG. 6 generates a power chart and thresholds (e.g., ON threshold, OFF threshold) based on the power chart. The example thresholds generator 440 of FIG. 6 includes a power chart generator 642, a chart analyzer 644 and a power level calculator 646. When the calibration period has expired (e.g., learning mode calibration period, recalibration mode calibration period), the example power chart generator 642 of FIG. 6 retrieves logged values from the list 500 generated by the example power logger 424 of FIG. 4 during the calibration period.

The example power chart generator 642 includes a tallier 602 and a similar value comparator 604. The example tallier 602 of FIG. 6 tallies the number of entries logged at each unique power measurement and generates a power chart using the tallies. In other words, when the list 500 of FIG. 5A includes a logged value 506 of three, the example tallier 602 counts the number of occurrences of 'three' in the logged values 506 of the list 500 during the calibration period (e.g., the previous day when in the recalibration mode) and updates the power chart at each count. When a retrieved logged value 506 is a new value (e.g., a value not in the power chart) and encountered by the example tallier 602, the example tallier 602 checks with the example similar value comparator 604 to determine whether the retrieved logged value 506 is similar to a value already tallied in the power chart within a threshold. In the illustrated example of FIG. 6, the similar value comparator 604 uses a graduated scale to compare whether two numbers are similar enough to be treated as corresponding to the same power state. For example, the example similar value comparator 604 uses a table such as, for example, the example comparison table 700 illustrated in FIG. 7A, to compare whether two numbers are sufficiently similar. The degree of necessary similarity varies depending on the magnitude of the value at issue. In the illustrated table 700 of FIG. 7A, when a newly encountered logged value 506 from the list 500 in the power chart is greater than 26 Watts, the example similar value comparator 604 determines whether the new logged value 506 falls within a 10% range of any of the logged values in the power chart. For example, if the power chart includes a logged value 506 of thirty (e.g., Watts), the example similar value comparator 604 determines whether the new logged value 506 is within 10% of 'thirty' (e.g., 27-33). When the retrieved logged value 506 is sufficiently similar (e.g., within the comparison range of 10% of thirty) to an existing value of the power chart, the tallier 602 increments the count for the existing value. In other words, a retrieved logged value 506 between 27 and 33 would lead to the count for 'thirty' being incremented in the power chart. When the retrieved logged value 506 is not similar to a logged value 506 in the power chart (e.g., not within the comparison range), the example tallier 602 adds the retrieved logged value 506 to the power chart. Other example comparison ranges are shown in the example table 700 of FIG. 7A for different logged values. For example, when the logged value 506 in the power chart is between 1 Watt and 2 Watts, the example similar value comparator 604 uses a 200% comparison range to determine if a retrieved logged value 506 is similar to the logged value 506 in the power chart. When the logged value 506 in the power chart is anywhere between 3 Watts and 6 Watts, the example similar value comparator 604 uses a 50% comparison range to determine if a retrieved logged value 506 is similar to the logged value 506 in the power chart. The example similar value comparator 604 of FIG. 6 uses a 30% comparison range when the logged value 506 in the power chart is anywhere between 7 Watts and 15 Watts. The example similar value comparator 604 of FIG. 6 uses a 20% comparison range when the logged value 506 in the power chart is anywhere between 16 Watts and 25 Watts.

As each of the entries of the list 500 correspond to an amount of time (e.g., one second), the number of entries logged at a certain power measurement (e.g., three) corresponds to an amount of time for which that power measurement was logged. In some examples, the tallier 602 also calculates the percent of time of the calibration period logged for each power measurement.

FIG. 7B is an example power chart 750 representative of values generated by the example power chart generator 642 of FIG. 6 during a separate time period than the example list 500 of FIG. 5A was generated. The example power chart 750 of FIG. 7B identifies unique power measurements logged in an example list (e.g., 3 Watts, 55 Watts, 23 Watts, and 14 Watts) in a first column 752, the number of times each power measurement (e.g., including similarly logged values) was logged in a second column 754 (e.g., because a log corresponds to one second, the number also corresponds to a number of seconds spent in the corresponding state), and the percentage of time spent at each logged power measurement in a third column 756. In the illustrated example power chart 750 of FIG. 7B, a three hundred second (e.g., five minute) calibration period was used. However, alternative periods of time can be used. In the illustrated example, the example tallier 602 counted two hundred twenty-two entries of 3 Watts, sixty-six entries of 55 Watts, nine entries of 23 Watts, and three entries of 14 Watts logged by the example power logger 424 of FIG. 4. The example power chart 750 of FIG. 7B shows that the percentage of time tallied for the power measurement of 3 Watts during the calibration period is seventy-four percent (e.g., 222/300*100=74%). Similar calculations are performed to populate the other rows of the percentage column 756.

The example chart generator 642 of FIG. 6 stores the generated power chart 750 in the example chart storage device 392 of FIG. 3. Further, the power chart 750 is accessed for analysis by the example chart analyzer 644 of FIG. 6. Alternatively and/or additionally, the example chart generator 642 outputs the generated power chart 750 to the example chart analyzer 644 of FIG. 6. The example chart analyzer 644 sorts the chart based on the amount of time tallied for each power measurement. For example, the chart analyzer 644 sorts the chart from greatest to least amount of time. In the illustrated example, the logged entries in the generated power chart 750 are organized (e.g., sorted) from most time to least time (of the time column 754) by the example chart analyzer 644. The example chart analyzer 644 then identifies the two most frequently logged power measurements in the power chart 750. For example, in the example power chart 750 of FIG. 7B, the example chart analyzer 644 identifies 3 Watts and 55 Watts as the most frequently logged power measurements. Identifying a different number of frequently logged power measurements is also possible. For example, a chart analyzer 644 can identify the four most frequently logged measurements. The example chart analyzer 644 identifies the most frequent power measurements based on an assumption that the information presentation device 102 is either in an ON state or an OFF state for a majority of the time, rather than in a transitional state, such as powering up or power off.

In the illustrated example of FIG. 6, the example power level calculator 646 utilizes the two most frequently logged power measurements from the example chart analyzer 644. In particular, the example power level calculator 646 of FIG. 6 identifies the lesser value of the two received power measurements as the OFF state power measurement. The identified OFF state power measurement represents the sensed power drawn by the information presentation device 102 while in the OFF state. In the illustrated example, when the power level calculator 646 of FIG. 6 receives the power measurements identified by the chart analyzer 644 (e.g., 3 Watts and 55 Watts), the power level calculator 646 identifies the 3 Watts power measurement as the OFF state power measurement.

As described above, the example time logger 422 of FIG. 4 maintains timing information to control different calibration modes of the example calibrator 320 of FIG. 3. When the example calibrator 320 of FIG. 3 is in the recalibration mode, the example power level calculator 646 of FIG. 6 identifies the greater of the two received power measurements from the example chart analyzer 644 as the ON state power measurement. For example, when the example power level calculator 646 receives the power measurements identified in the example power chart 750 of FIG. 7B (e.g., 3 Watts and 55 Watts) by the example chart analyzer 644, the example power level calculator 646 identifies the 55 Watts power measurement as the ON state power measurement.

When the example calibrator 320 of FIG. 3 is in the learning mode, the example power level calculator 646 of FIG. 6 determines the ON state power measurement based on the OFF state power measurement. In order to identify an accurate OFF state power measurement, in some examples, the information presentation device 102 is left in the OFF state for the duration of the learning period. As a result, the power chart is not used to identify an ON state power during the learning mode. Instead, the example power level calculator 646 of FIG. 6 calculates the ON state power measurement as five times the OFF state power measurement when in the learning mode. In some examples, the power level calculator 646 of FIG. 6 compares the calculated ON state power measurement with a threshold expected ON value (e.g., a minimum value expected for an ON state). For example, when the calculated ON state power measurement is less than the threshold expected ON value, the calculated state power measurement is discarded and the threshold expected ON value is set as the ON state power measurement. By using this threshold, the example thresholds generator 440 of FIG. 6 is able to adapt to the wide range of power settings included in modern information presentation devices 102. For example, some new energy star televisions draw less than 2 Watts while in the OFF state, but draw anywhere between 30 and 200 Watts in the ON state. In such an example, calculating the ON state power measurement by multiplying the OFF state power measurement (e.g., 2 Watts) yields an inaccurate ON threshold (e.g., 10 Watts) and the example state detector 370 of FIG. 3 would, thus, yield inaccurate power states if such a threshold were employed. Therefore, the threshold expected ON value (e.g., 50 Watts) is used by the example thresholds generator 440 to generate the ON threshold in such circumstances.

The example thresholds generator 440 of FIG. 6 includes an OFF threshold calculator 648, an ON threshold calculator 650 and a thresholds checker 652. In the illustrated example of FIG. 6, the example OFF threshold calculator 648 receives the OFF state power measurement from the example power level calculator 646 based on the power chart 750. The example OFF threshold calculator 648 calculates an OFF threshold that is greater than the OFF state power measurement. In some examples, the example OFF threshold calculator 648 uses a graduated scale to calculate the OFF threshold. For example, the example OFF threshold calculator 648 uses a table such as, for example, the example table 800 illustrated in FIG. 8, to calculate the OFF threshold. In the illustrated table 800 of FIG. 8, when the OFF state power measurement calculated by the power level calculator 646 is anywhere from 3 Watts to 10 Watts, the example OFF threshold generator 648 calculates the OFF threshold by multiplying the OFF state power measurement by two.

Other example multipliers are shown in the example table 800 of FIG. 8 for different power levels. For example, when the OFF state power measurement calculated by the power level calculator 646 is anywhere from 10 Watts to 20 Watts, the example OFF threshold generator 648 calculates the OFF threshold by multiplying the OFF state power measurement by 1.5. When the OFF state power measurement calculated by the power level calculator 646 is greater than 20 Watts, the example OFF threshold generator 648 calculates the OFF threshold by multiplying the OFF state power measurement by 1.2, based on the illustrated table 800 of FIG. 8. The example OFF threshold generator 648 sets the OFF threshold at 5 Watts when the OFF state power measurement is 2 Watts, and sets the OFF threshold at 3 Watts when then OFF state power measurement is 1 Watt.

In the illustrated example of FIG. 6, the example ON threshold calculator 650 receives the ON state power measurement from the example power level calculator 646 based on the power chart 750. The example ON threshold calculator 650 calculates an ON threshold that is less than the ON state power measurement reflected in the power chart 750. In some examples, the example ON threshold calculator 650 uses a graduated scale to calculate the ON threshold. For example, the example ON threshold calculator 650 uses a table such as, for example, the example table 900 illustrated in FIG. 9, to generate the ON threshold. In the illustrated table 900 of FIG. 9, when the ON state power measurement is between 70 Watts and 100 Watts, the example ON threshold generator 650 calculates the ON threshold by multiplying the ON state power measurement by 0.7. Other example multipliers are shown in the example table 900 of FIG. 9 for different power levels. For example, when the ON state power measurement is less than 70 Watts, the example ON threshold generator 650 calculates the ON threshold by multiplying the ON state power measurement by 0.6. When the ON state power measurement is greater than 100 Watts, the example ON threshold generator 650 calculates the ON threshold by multiplying the ON state power measurement by 0.8, based on the illustrated table 900 of FIG. 9.

In the illustrated example of FIG. 6, the example thresholds checker 652 compares the ON threshold generated by the example ON threshold calculator 650 to the OFF threshold generated by the example OFF threshold calculator 648. In the illustrated example, the thresholds checker 652 determines whether the ON threshold differs from the OFF threshold by an ON/OFF difference threshold (e.g., twenty percent). The example thresholds checker 652 compares the ON threshold and OFF threshold because certain scenarios can yield undesirable thresholds. For example, when the information presentation device 102 is left in the OFF state for the entire recalibration period (e.g., the information presentation device is unplugged from the power source 101), the example thresholds generator 440 identifies the same power measurement as the OFF state power measurement and the ON state power measurement. In such examples, attempting to detect the state of the information presentation device 102 using these state power measurements would generate irrelevant and/or misleading data. Thus, the example thresholds generator 440 of FIG. 6 checks whether the generated thresholds are acceptable. When the difference between the ON threshold and OFF threshold is less than the ON/OFF difference threshold, the example thresholds checker 652 outputs a negative indication (e.g., output a No, 0, false). When the indication from the example thresholds checker 652 of FIG. 6 is negative, the example threshold storage device 394 of FIG. 3 discards the generated thresholds and re-stores the thresholds generated during the previous calibration period.

When the difference between the ON threshold and OFF threshold is greater than the ON/OFF difference threshold, the example thresholds checker 652 of FIG. 6 outputs the ON and OFF threshold values and/or a positive indication that the received ON threshold and OFF threshold passed the check (e.g., output a Yes, 1, true). When the indication from the example thresholds checker 652 is positive, the example threshold storage device 394 of FIG. 3 stores the generated thresholds to be used by the example state detector 370 of FIG. 3 during state detection of the information presentation device 102. Thus, the example calibrator 320 of FIG. 3 continuously (e.g., repeatedly) calibrates the meter 120 by identifying and/or adjusting the thresholds on which the state determinations of the example state detector 370 are based.

While an example manner of implementing the meter 120 of FIG. 1 has been illustrated in FIG. 3, one or more of the elements, processes, and/or devices illustrated in FIG. 3 may be combined, divided, re-arranged, omitted, and/or implemented in any other way. Further, the example calibrator 320, the example state detector 370, the example chart storage device 392, the example threshold storage device 394, the example state ID storage device 396 and/or, more generally, the example meter 120 of FIG. 3 may be implemented by hardware, software, firmware and/or any combination of hardware, software and/or firmware. Thus, for example, any of the example calibrator 320, the example state detector 370, the example chart storage device 392, the example threshold storage device 394, the example state ID storage device 396 and/or, more generally, the example meter 120 of FIG. 3 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example calibrator 320, the example state detector 370, the example chart storage device 392, the example threshold storage device 394, and/or the example state ID storage device 396 are hereby expressly defined to include a tangible computer readable medium such as a memory, DVD, CD, Blu-ray, etc. storing the software and/or firmware. Further still, the example meter 120 of FIG. 3 may include one or more elements, processes and/or devices in addition to, or instead of, those illustrated in FIG. 3, and/or may include more than one of any or all of the illustrated elements, processes and devices.

While an example manner of implementing the calibrator 320 of FIG. 3 has been illustrated in FIG. 4, one or more of the elements, processes, and/or devices illustrated in FIG. 4 may be combined, divided, re-arranged, omitted, and/or implemented in any other way. Further, the example time logger 422, the example power logger 424, the example running average calculator 426, the example comparator 428, the example logging value recorder 430, the example thresholds generator 440 and/or, more generally, the example calibrator 320 of FIG. 4 may be implemented by hardware, software, firmware and/or any combination of hardware, software and/or firmware. Thus, for example, any of the example time logger 422, the example power logger 424, the example running average calculator 426, the example comparator 428, the example logging value recorder 430, the example thresholds generator 440 and/or, more generally, the example calibrator 320 of FIG. 4 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example time logger 422, the example power logger 424, the example running average calculator 426, the example comparator 428, the example logging value recorder 430, and/or the example thresholds generator 440 are hereby expressly defined to include a tangible computer readable medium such as a memory, DVD, CD, Blu-ray, etc. storing the software and/or firmware. Further still, the example calibrator 320 of FIG. 4 may include one or more elements, processes and/or devices in addition to, or instead of, those illustrated in FIG. 4, and/or may include more than one of any or all of the illustrated elements, processes and devices.

While an example manner of implementing the thresholds generator 440 of FIG. 4 has been illustrated in FIG. 6, one or more of the elements, processes, and/or devices illustrated in FIG. 6 may be combined, divided, re-arranged, omitted, and/or implemented in any other way. Further, the example power chart generator 642, the example chart analyzer 644, the example power level calculator 646, the example OFF threshold calculator 648, the example ON threshold calculator 650, the example thresholds checker 652 and/or, more generally, the example thresholds generator 440 of FIG. 6 may be implemented by hardware, software, firmware and/or any combination of hardware, software and/or firmware. Thus, for example, any of the example power chart generator 642, the example chart analyzer 644, the example power level calculator 646, the example OFF threshold calculator 648, the example ON threshold calculator 650, the example thresholds checker 652 and/or, more generally, the example thresholds generator 440 of FIG. 6 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example power chart generator 642, the example chart analyzer 644, the example power level calculator 646, the example OFF threshold calculator 648, the example ON threshold calculator 650 and/or the example thresholds checker 652 are hereby expressly defined to include a tangible computer readable medium such as a memory, DVD, CD, Blu-ray, etc. storing the software and/or firmware. Further still, the example thresholds generator 440 of FIG. 6 may include one or more elements, processes and/or devices in addition to, or instead of, those illustrated in FIG. 6, and/or may include more than one of any or all of the illustrated elements, processes and devices.

Figure 10:
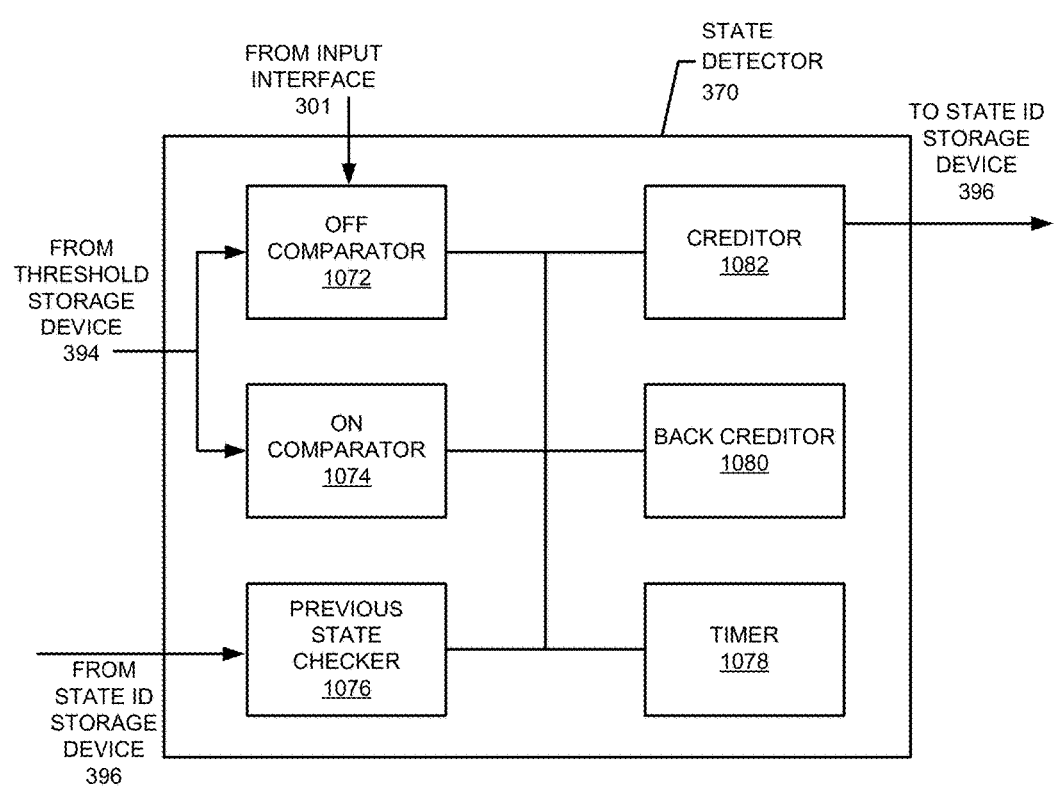
FIG. 10 is a block diagram of an example implementation of the example state detector of FIG. 3.

FIG. 10 is an example implementation of the example state detector 370 of FIG. 3. In the illustrated example of FIG. 10, the state detector 370 of FIG. 3 detects the state of an information presentation device such as, for example, the information presentation device 102 of FIG. 1. As described above, the example state detector 370 of FIG. 3 determines the state of the information presentation device 102 (e.g., ON or OFF) based on a plurality of thresholds generated by the example calibrator 320 of the example meter 120 of FIG. 1. The example state detector 370 compares the received power measurements from the example sensor 110 of FIG. 2 to the stored thresholds generated by the example calibrator 320 to identify the state of the information presentation device 102. As the example state detector 370 determines the state of the information presentation device 102, the example state detector 370 records the state determinations in a state ID storage device 396 and/or transmits the state determinations (e.g., periodically, aperiodically, continuously) to the example central facility 160 of FIG. 1.

Figure 11:
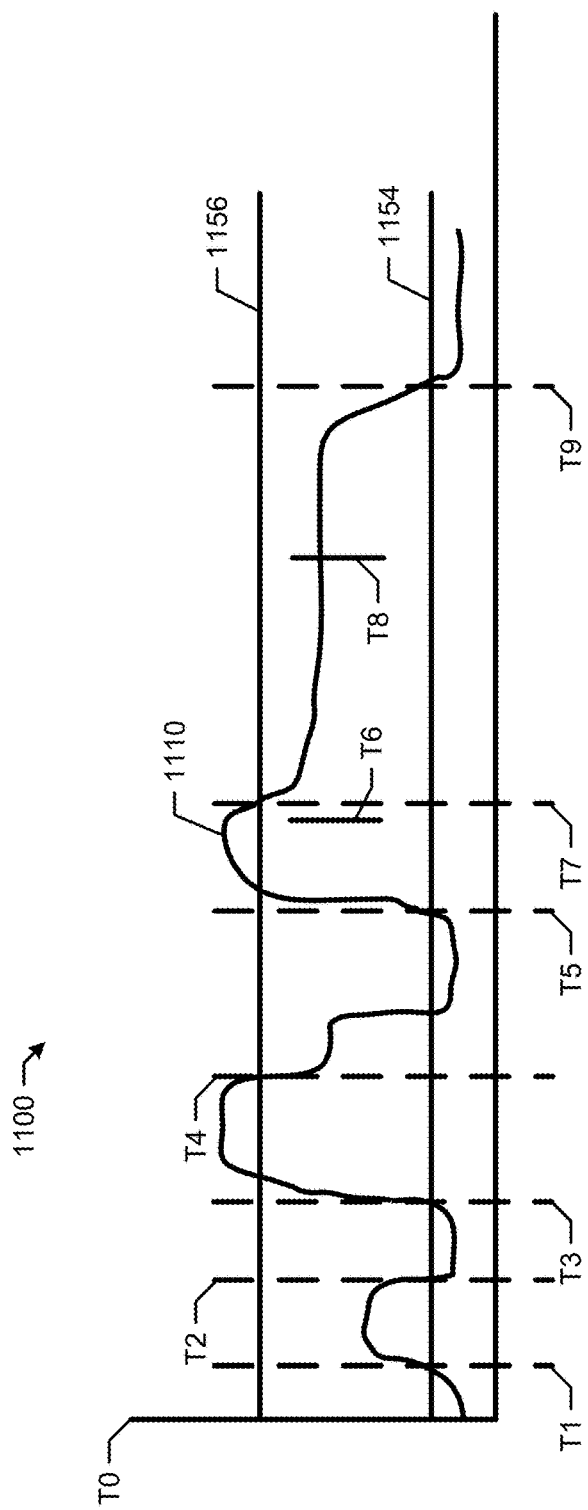
FIG. 11 illustrates an example graph representative of power measurements received by the example meter of FIGS. 1 and/or 3.

FIG. 11 is an example graph 1100 representative of power measurements 1110 received by the example meter 120 of FIG. 3 via the sensor 110 over a period of time. The example graph 1100 includes an OFF threshold 1154 and an ON threshold 1156 that correspond to values stored in the example thresholds storage device 394 of FIG. 3. The example graph 1100 of FIG. 11 is described in connection with the example state detector 370 of FIG. 10 for purposes of illustration.

The example state detector 370 of FIG. 10 includes an OFF comparator 1072, an ON comparator 1074, a previous state checker 1076, a timer 1078, a back creditor 1080 and a creditor 1082. The example OFF comparator 1072 of FIG. 10 compares a power measurement taken by the example sensor 110 of FIGS. 1 and/or 2 and the OFF threshold from the example threshold storage device 394. In the illustrated example, when the received power measurement 1110 is less than the OFF threshold 1154 (e.g., as in the time period between T2 and T3), the example information presentation device 102 is determined to be in the OFF state by the state detector 370. As a result, the example OFF comparator 1072 of FIG. 10 outputs a positive indication (e.g., yes, 1, true, etc.) to the creditor 1082 to indicate that the information presentation device 102 is OFF (e.g., not outputting media). Conversely, when the received power measurement 1110 is greater than the OFF threshold, the information presentation device 102 could be in the ON state or an indeterminate state (e.g., booting down). As a result, when the received power measurement 1110 is greater than the OFF threshold, the power state of the example information presentation device 102 is not known (to the OFF comparator 1072) and the example OFF comparator 1072 of FIG. 10 outputs a negative indication (e.g., no, 0, false, etc.) to the example creditor 1082.

In the illustrated example of FIG. 10, the ON comparator 1074 compares a power measurement from the example sensor 110 of FIGS. 1 and/or 2 and the ON thresholds from the example threshold storage device 394. With reference to the example graph 1100 of FIG. 11, when the received power measurement 1110 is greater than the ON threshold 1154 (e.g., during the time period between T3 and T4), the example information presentation device 102 is determined to be in the ON state. As a result, the example ON comparator 1074 of FIG. 10 outputs a positive indication to the creditor 1082 that the information presentation device 102 is in an ON state. In the illustrated example of FIG. 10, when the received power measurement is less than the ON threshold, the information presentation device 102 could be in the OFF state or the indeterminate state (e.g., booting down). As a result, when the received power measurement is less than the ON threshold, the power state of the example information presentation device 102 is not known (to the ON comparator 1074) and the example ON comparator 1074 of FIG. 10 outputs a negative indication to the example creditor 1082.

As described above, when the received power measurement is between the OFF and ON thresholds (e.g., during the time period between T7 and T9 in the example graph of FIG. 11), the power state of the information presentation device 102 is indeterminate. For example, the example information presentation device 102 may be, for example, turning OFF or the example information presentation device 102 may be, for example, switching to a low power consuming state (e.g., Input mode or Black screen) and still in an ON state. When the received power measurement is determined to correspond to the information presentation device 102 being in the indeterminate state (e.g., when the OFF comparator 1072 and the ON comparator 1074 output a negative indication), the power state of the information presentation device 102 is determined based on the actions (e.g., transition up, transition down, etc.) of the information presentation device 102 while in the indeterminate state and from which state the information presentation device 102 transitioned into the indeterminate state.

In the illustrated example of FIG. 10, the example previous state checker 1076 receives an indication from the example OFF comparator 1072, an indication from the example ON comparator 1074 and the previous state of the example information presentation device 102. In some examples, the example previous state checker 1076 receives the previous state from the example creditor 1082. In some examples, the example previous state checker 1076 receives the previous state from the example state ID storage device 396 of FIG. 3. In other examples, the previous state checker 1076 retains the previous state in a local memory or register. When the example previous state checker 1076 of FIG. 10 receives a negative indication (e.g., no, 0, false, etc.) from both the example OFF comparator 1072 and the example ON comparator 1074, the example previous state checker 1076 checks the received previous state of the information presentation device 102 to determine whether the information presentation device 102 was previously in the OFF state or in the ON state. When the previous state of the example information presentation device 102 is the OFF state (e.g., during the indeterminate state between T1 and T2 on the example graph of FIG. 11), the example previous state checker 1076 of FIG. 10 outputs an indication that the power state of the information presentation device 102 is in the ON state because the OFF state power measurement is considered to be the lowest, stable power drawn by the example information presentation device 102 of FIG. 1. This assumption is valid because the information presentation device 102 does not draw less power while in any state compared to the OFF state. As a result, in examples when the previous power state is determined by the example previous state checker 1076 to be in the OFF state, the example previous state checker 1076 of FIG. 10 correctly determines the power state of the information presentation device 102 to be in the ON state.

When the example previous state checker 1076 of FIG. 10 determines the previous power state of the example information presentation device 102 was in the ON state, in some examples, the example previous state checker 1076 outputs an indication that the information presentation device 102 power state is indeterminate. For example, the example information presentation device 102 may include a slow boot-down period when transitioning from the ON state to the OFF state causing the power drawn by the information presentation device 102 to remain greater than while in the OFF state (e.g., cooling fans continue to draw power until they turn off). In some examples, the example information presentation device 102 switches from an ON state to an energy efficient state (e.g., an Input screen), thereby causing the power measurement to transition from the ON state into the indeterminate state. Determining whether the example information presentation device 102 of FIG. 1, is in a boot down or an energy efficient state helps accurately determine the power state of the information presentation device 102.

In some examples, an example information presentation device 102 may have a significant boot down period (e.g., between 30 seconds and 2 minutes) before the sensed power measurement by the example sensor 110 of FIG. 2 drops below the OFF threshold. In some such examples, if the boot down period is incorrectly stored as in the ON state, inaccurate data regarding media exposure is generated for the example monitored site 98 of FIG. 1. For example, an advertisement lasting only 30 seconds could be credited even though no exposure to the advertisement occurred. Thus, it is important to accurately determine the power state of the example information presentation device 102 while the received power measurement is in the indeterminate state.

In the illustrated example of FIG. 10, the example timer 1078 initiates a delay period when the example previous state checker 1076 outputs an indeterminate state (e.g., between OFF threshold 1154 and ON threshold 1156 in the illustrated graph of FIG. 11). For example, the example timer 1078 begins a three minute countdown when initiated. However, alternative periods of time are possible. When the delay period is initiated, in some examples, the example creditor 1082 of FIG. 10 delays outputting power states (e.g., to the example state ID storage device 396 and/or the example central facility 160 of FIG. 1). As described above, some information presentation device's 102 include a boot down period when transitioning from the ON state to the OFF state and the boot down period may be for a significant period of time (e.g., between 30 seconds and 2 minutes). Thus, a delay period longer than the boot down period is selected. In some examples, a three minute delay period sufficiently exceeds the boot down period observed in the example information presentation device 102.

In the illustrated example of FIG. 10, the example back creditor 1080 receives information from the example timer 1078 indicating the status of the delay period. The example back creditor 1080 of FIG. 10 monitors the power measurement sensed by the example sensor 110 of FIG. 2 during the delay period. When the power measurement during the delay period drops below the OFF threshold (e.g., is in the OFF state), the example back creditor 1080 of FIG. 10 determines the example information presentation device 102 was in a boot down period. In the illustrated example graph of FIG. 11, the period between time T4 and time T5 is back credited as OFF because the example power measurement 1110 drops below the example OFF threshold 1154 before the delay period (e.g., time T4 to time T6) expired. When the example back creditor 1080 identifies the boot down period, the example back creditor 1080 outputs data indicating the duration of the delay period spent in the indeterminate state should be back credited as the information presentation device 102 in the OFF state. For example, the example back creditor 1080 outputs data to the example creditor 1082 of FIG. 10 to resume outputting power states of the example information presentation device 102. Additionally and/or alternatively, the example back creditor 1082 outputs data indicating the duration of the delay period in the indeterminate state should be credited as OFF. Thus, the example state detector 370 of FIG. 3 correctly identifies the example information presentation device 102 was no longer in the ON state and this information can be used (e.g., by audience measurement entities) to accurately generate statistics regarding media exposure at the example monitored site 98.

In some examples when the received power measurement does not drop below (e.g., is less than) the OFF threshold (e.g., remains in the indeterminate state and/or returns above the ON threshold) during the duration of the delay period (e.g., during the 3 minute delay period), the example back creditor 1080 of FIG. 10 correctly identifies the example information presentation device 102 was not turned OFF. Rather, the example information presentation device 102 may have, for example, switched to an energy saving mode when media is still presented. For example, in the illustrated example graph of FIG. 11, the example power measurement 1110 remains in the indeterminate state during the entire delay period (e.g., during the time period between time T7 and time T8). Thus, the duration of the delay period is properly credited as the information presentation device 102 in the ON state. Additionally, the example back creditor 1080 of FIG. 10 outputs data indicating that additional power measurements in the indeterminate state should continue to be credited as in the ON state until the received power measurement drops below the OFF threshold. For example, if a delay period of three minutes is used and the sensed power measurement by the example sensor 110 of FIG. 2 indicates the example information presentation device 102 is in the indeterminate state for ten minutes before dropping below the OFF threshold (e.g., less than the OFF threshold), the three minutes of the delay period are back credited as ON once the delay period expires and, going forward, the remaining seven minutes are also credited as in the ON state. Thus, the example state detector 370 of FIG. 3 correctly identifies the example information presentation device 102 was in the ON state and this information can be used (e.g., by audience measurement entities) to accurately generate statistics regarding media exposure at the example monitored site 98.

In the illustrated example of FIG. 10, the creditor 1082 outputs detected states of the example information presentation device 102. In some examples, the creditor 1082 receives state information from the OFF comparator 1072, the ON comparator 1074, the previous state checker 1076, the timer 1078 and/or the example back creditor 1080. In some examples, the example creditor 1082 embeds (e.g., appends, prepends, etc.) a time stamp to the output state. As a result, the example meter 120 of FIG. 3 determines, for example, whether the example information presentation device 102 is in the ON state or the OFF state at a given time and/or for a given period of time. In some examples, the example creditor 1082 of FIG. 10 delays (e.g., postpones) outputting power states, for example, when the example timer 1078 initiates a delay period. In some examples, the example creditor 1082 outputs data received from the example back creditor 1080 indicating the power state of the example information presentation device 102 for at least a portion of the delay period. Thus, the example meter 120 of FIG. 3 correctly detects the state of the example information presentation device 102 through repeatedly recalibrated thresholds and comparing the received (e.g., sensed) power measurements to the thresholds.

During operation of the example meter 120 of FIG. 3, unique power draw situations may arise. For example, a user may leave the example information presentation device 102 in a state for the entire recalibration period (e.g., left in the OFF state for the entire recalibration period). In such instances, the example thresholds generator 440 of FIG. 4 prevents thresholds from being set that yield useless usage information by performing checks on the thresholds and discarding the useless thresholds.

In some examples, an example information presentation device 102 may be switched into a new mode such as, for example, a Fast ON mode. In some such examples, the example information presentation device 102 does not completely turn OFF while in the OFF state. Rather, the example information presentation device 102 is set so that the example information presentation device 102 can be quickly turned back on (e.g., light sources such as light bulbs and/or LEDs used to illuminate the screen are not fully turned OFF and the startup time is greatly reduced). In some such examples, the received (e.g., sensed) power measurement of the example information presentation device 102 does not go below the calibrated OFF threshold when in the OFF state. However, as the example calibrator 320 of FIG. 3 automatically recalibrates (e.g., periodically, aperiodically, on a set schedule, when an event occurs, etc.), the detected states are not incorrect for an extended period of time. Rather, the example calibrator 320 of FIG. 3 recalibrates a new OFF state power measurement and a new OFF threshold to reflect the updated power mode of the example information presentation device 102.

While an example manner of implementing the state detector 370 of FIG. 3 has been illustrated in FIG. 10, one or more of the elements, processes, and/or devices illustrated in FIG. 10 may be combined, divided, re-arranged, omitted, and/or implemented in any other way. Further, the example OFF comparator 1072, the example ON comparator 1074, the example previous state checker 1076, the example timer 1078, the example back creditor 1080, the example creditor 1082 and/or, more generally, the example state detector 370 of FIG. 10 may be implemented by hardware, software, firmware and/or any combination of hardware, software and/or firmware. Thus, for example, any of the example OFF comparator 1072, the example ON comparator 1074, the example previous state checker 1076, the example timer 1078, the example back creditor 1080, the example creditor 1082 and/or, more generally, the example state detector 370 of FIG. 10 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example OFF comparator 1072, the example ON comparator 1074, the example previous state checker 1076, the example timer 1078, the example back creditor 1080 and/or the example creditor 1082 are hereby expressly defined to include a tangible computer readable medium such as a memory, DVD, CD, Blu-Ray, etc. storing the software and/or firmware. Further still, the example state detector 370 of FIG. 10 may include one or more elements, processes and/or devices in addition to, or instead of, those illustrated in FIG. 10, and/or may include more than one of any or all of the illustrated elements, processes and devices.

Figure 12:
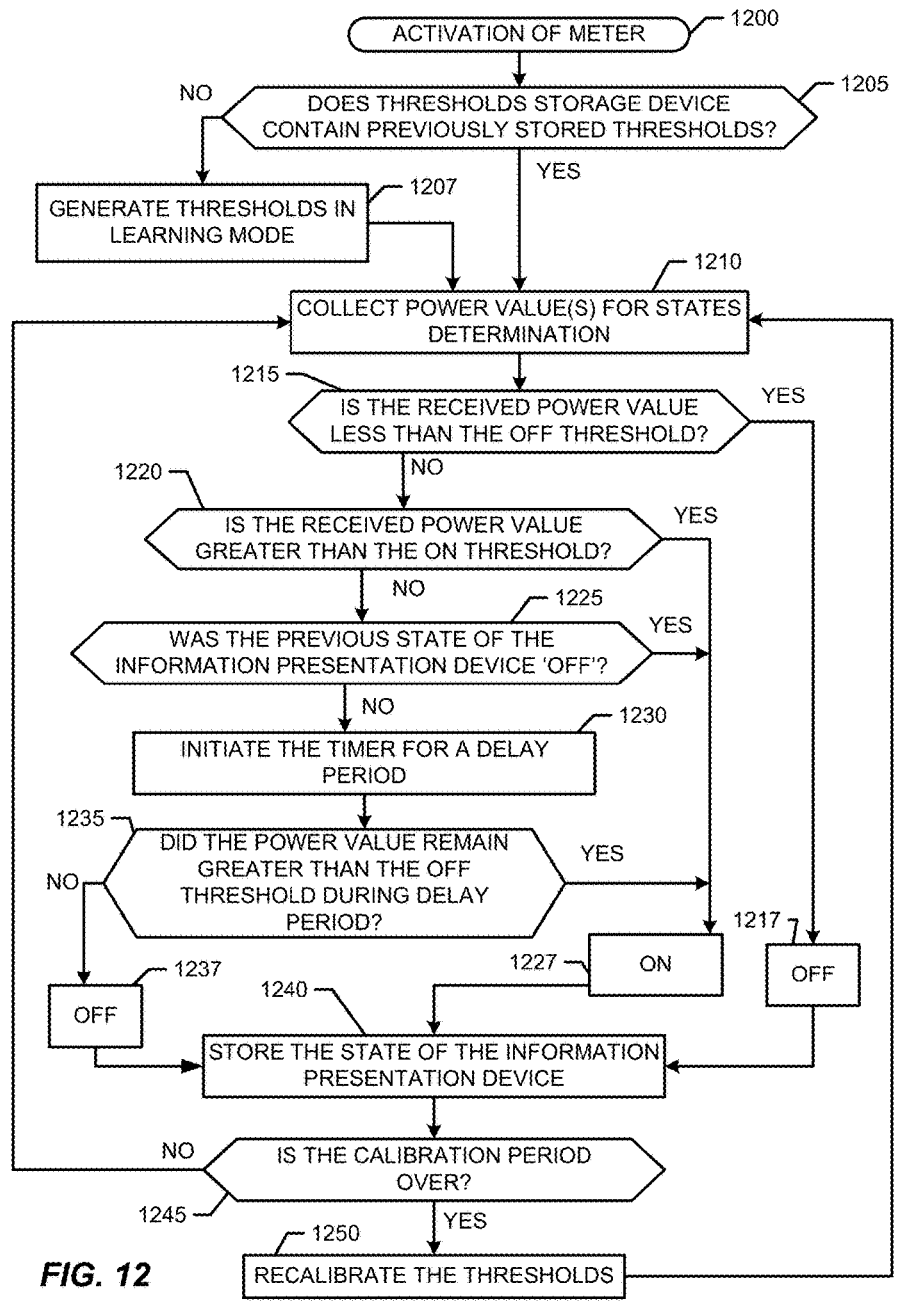
FIG. 12 is a flowchart representative of example machine readable instructions that may be executed to implement the example meter of FIGS. 1 and/or 3.
Figure 13:
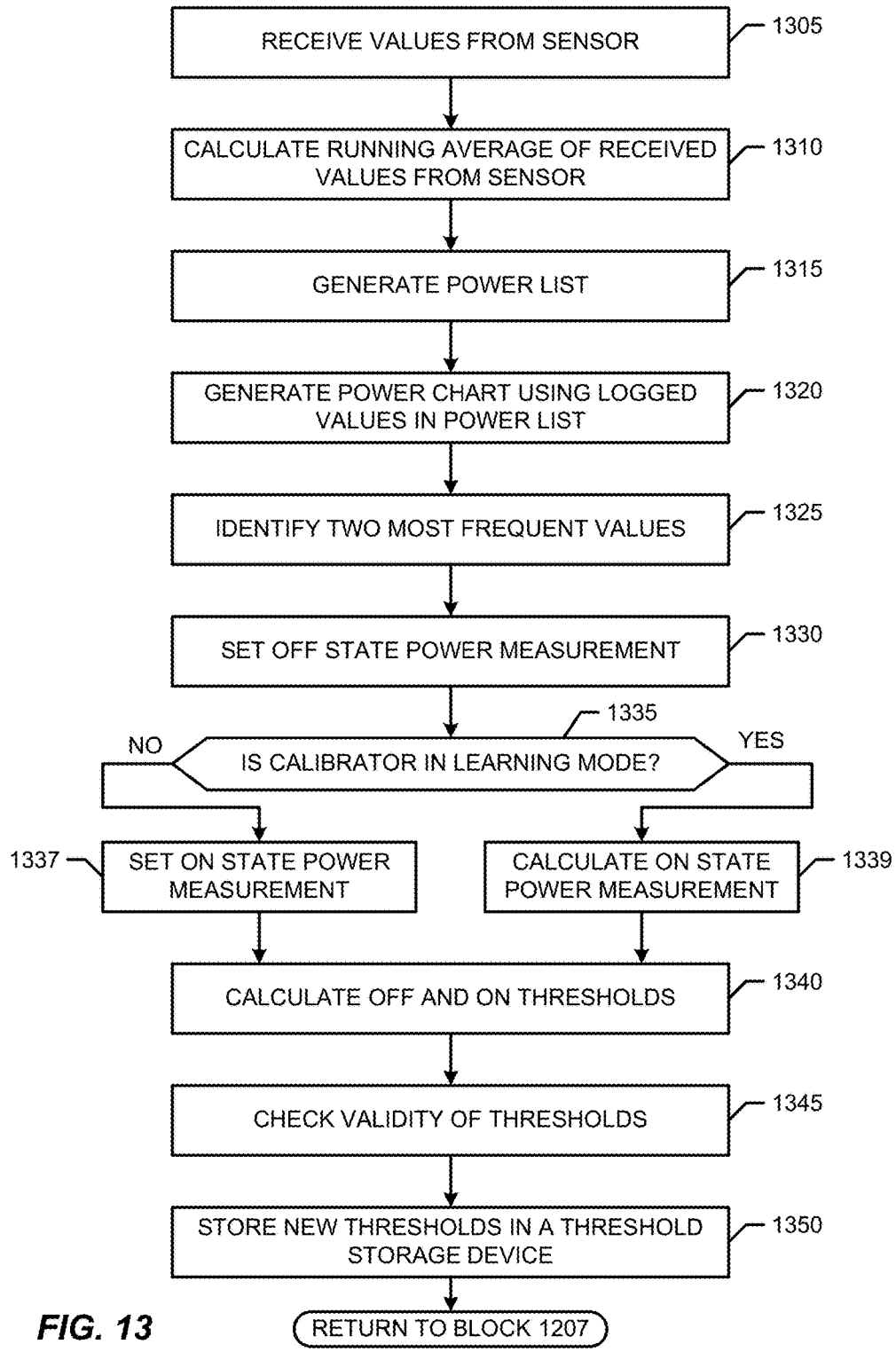
FIG. 13 is a flowchart representative of example machine readable instructions that may be executed to implement the example calibrator of FIGS. 3, 4 and/or 6.
Figure 15:
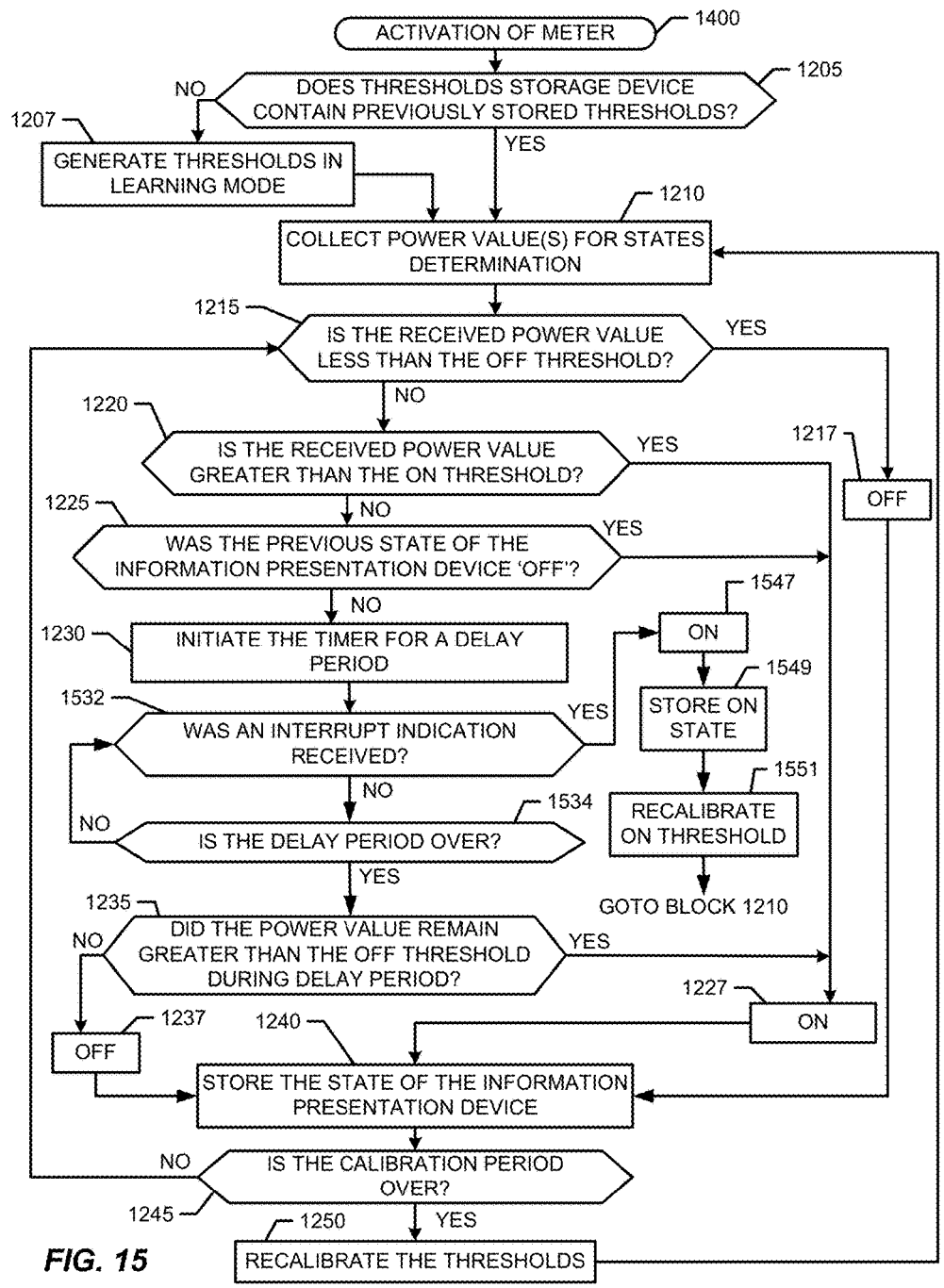
FIG. 15 is a flowchart representative of example machine readable instructions that may be executed to implement the second example meter of FIG. 14.

Flowcharts representative of example machine readable instructions for implementing the meter 120 of FIGS. 1 and/or 3 and/or 14 are shown in FIGS. 12, 13 and 15. In the illustrated examples, the machine readable instructions comprise a program for execution by a processor such as the processor 1612 shown in the example processing platform 1600 discussed below in connection with FIG. 16. The program may be embodied in software stored on a tangible computer readable medium such as a CD-ROM, a floppy disk, a hard drive, a digital versatile disk (DVD), a Blu-ray disk, or a memory associated with the processor 1612, but the entire program and/or parts thereof could alternatively be executed by a device other than the processor 1612 and/or embodied in firmware or dedicated hardware. Further, although the example program is described with reference to the flowcharts illustrated in FIGS. 12, 13 and 15, many other methods of implementing the example meter 120 may alternatively be used. For example, the order of execution of the blocks may be changed, and/or some of the blocks described may be changed, eliminated, or combined.

As mentioned above, the example processes of FIGS. 12, 13 and 15 may be implemented using coded instructions (e.g., computer readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage medium and to exclude propagating signals. Additionally or alternatively, the example processes of FIGS. 12, 13 and 15 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable storage medium and to exclude propagating signals. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

The example of FIG. 12 begins at an activation of the example meter 120 (block 1200). The activation at the onset of the example of FIG. 3 corresponds to, for example, the meter 120 being installed in a household, such as the monitored site 98 of FIG. 1. The example calibrator 320 of FIG. 3 determines whether previously generated thresholds are stored in the example threshold storage device 394 (block 1205). If the example threshold storage device 394 does not include threshold values, the example calibrator 320 operates in learning mode to generate thresholds and store the thresholds in the example threshold storage device 394 (block 1207). As described above, generation of the thresholds in the learning mode includes calibrating an OFF threshold and setting an ON threshold in accordance with the example calibrator 140 of FIGS. 3 and/or 4. An example implementation of block 1207 is described below in connection with FIG. 13. When the thresholds have been generated in the learning mode, control proceeds to block 1210, which corresponds to a collection of power values from the example sensor 110 for purposes of detecting a state of the information presentation device 102 (FIG. 1). Alternatively, if the threshold storage device 394 includes thresholds (block 1205), control proceeds to block 1210.

To begin a determination of a current state of the information presentation device 102, the example state detector 370 of FIG. 3 compares the current power value (e.g., measurement of power drawn by the information presentation device 102) received from the example sensor 110 of FIGS. 1 and/or 2 to an OFF threshold (e.g., an OFF threshold calibrated during the learning mode and/or stored in the example threshold storage device 394) (block 1215). If the power value received from the example sensor 110 is less than the OFF threshold, the example state detector 370 determines the example information presentation device 102 is in the OFF state (block 1217). Otherwise, if the power value received from the example sensor 110 is greater than or equal to the OFF threshold, the example state detector 370 proceeds to compare the power value received from the example sensor 110 to an ON threshold (e.g., an ON threshold set during the learning mode and/or stored at the example threshold storage device 394) (block 1220). If the power value received from the example sensor 110 is greater than the ON threshold, the example state detector 370 determines the example information presentation device 102 is in the ON state (block 1227). Otherwise, if the received power value is less than or equal to the ON threshold, the example state detector 370 determines that the power value corresponds to an intermediate value. Accordingly, the example state detector 370 determines whether the previously logged state of the example information presentation device 102 was in the OFF state (block 1225). If the previous state of the information presentation device 102 is the OFF state, the example state detector 370 determines the example information presentation device 102 in in the ON state (block 1227).

If the previous state of the example information presentation device 102 is determined to be a state other than the OFF state, then the example timer 1078 of FIG. 10 initiates a delay period (block 1230). During the delay period, the example state detector 370 monitors whether the values received from the example sensor 110 drop below the OFF threshold (block 1235). If a power values drops below the OFF threshold during the delay period, the example state detector 370 determines the example information presentation device 102 is in the OFF state (block 1237). Additionally, in some examples, the example state detector 370 back credits the example information presentation device 102 in the OFF state for the period of time that the value received from the sensor 110 was greater than the OFF threshold. Otherwise, if the power values do not drop below the OFF threshold during the delay period, the example state detector 370 back credits the example information presentation device 102 in the ON state for the time period corresponding to the duration of the delay period (block 1227). Additionally, the example state detector 370 continues crediting the example information presentation device 102 as in the ON state until the value received from the example sensor 110 is less than the OFF threshold from the example threshold storage device 394.

When the power state of the example information presentation device has been determined (e.g., blocks 1217, 1227 and/or 1237), the example state detector 370 stores the power state of the example information presentation device 102 in the example state ID storage device 396 (block 1240). If the calibration period for the current iteration (e.g., twenty-four hour period) has not expired (block 1245), control returns to block 1210 and additional power values are received. Otherwise, if the calibration period for the current iteration has expired (block 1245), the example calibrator 320 recalibrates the thresholds (block 1250). The re-calibrations referred to at block 1250 are described in detail below in connection with FIG. 13. Control then returns to block 1210.

The example of FIG. 13 begins with the example power logger 424 receiving a value from the example sensor 110 of FIGS. 1 and/or 2 (block 1305). The example running average calculator 426 calculates a running average of the values received from the example sensor 110 over a period of time (block 1310). Further, a list of power measurements (e.g., the list 500 of FIG. 5A) is generated based on a comparison of the values received from the example sensor 110 and the calculated running average (block 1315). In particular, the list reflects power measurements within a percentage of the running average, and the power measurements not within the percentage are discarded and a previously logged power measurement is re-logged.

The example thresholds generator 440 generates a power chart (e.g., the power chart 750 of FIG. 7B) based on the number of times a power measurement appeared in the power list relative to other power measurements (block 1320). The example thresholds generator 440 identifies the two most frequently appearing power measurements in the power chart (block 1325). The example thresholds generator 440 identifies the lesser value of the two identified power measurements and sets the OFF state power measurement in accordance with the lesser value (block 1330). Further, the example thresholds generator 440 determines whether the example calibrator 320 of FIG. 3 is in the learning mode (block 1335). If not in the learning mode (e.g., in the recalibration mode), the example thresholds generator 440 sets the ON state power measurement by identifying the greater value of the two identified power measurements from the power chart (block 1337). Otherwise, if in the learning mode (block 1335), the example thresholds generator 440 calculates an ON state power measurement based off of the corresponding OFF state power measurement (block 1339). The example thresholds generator 440 calculates an OFF threshold greater than the OFF state power measurement and calculates an ON threshold less than the ON state power measurement (block 1340). The example thresholds generator 440 checks whether the OFF threshold differs from the ON threshold by a minimum percentage and outputs an indication indicative of the validity of the thresholds (e.g., ON and/or OFF) (block 1345). Based on the received validity indication, the calibrator 320 stores either the new threshold values in the example threshold storage device 394 of FIG. 3 (e.g., when the new threshold values are deemed valid at block 1345) or the previous thresholds (e.g., when the new threshold values are deemed invalid at block 1345) in the example threshold storage device 394 of FIG. 3 (block 1350). Control then returns to block 1207 of FIG. 12 to enable the example state detector 370 of FIG. 3 to detect the state of the example information presentation device 102 based on the thresholds stored in the example threshold storage device 394.

Figure 14:
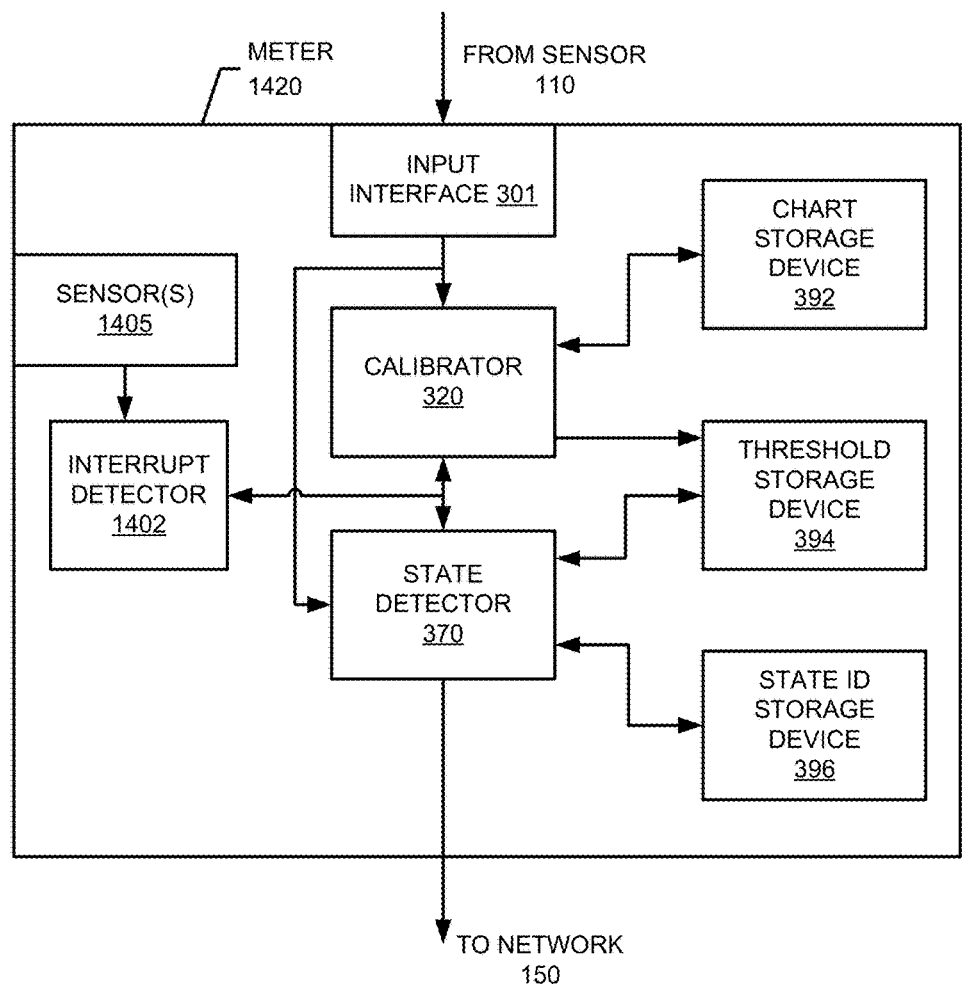
FIG. 14 is a block diagram of a second example implementation of the example meter of FIG. 1.

FIG. 14 illustrates a second example implementation of the example meter 120 of FIG. 1. As described above in connection with the example meter 120 of FIG. 3, the example meter 1420 is used to determine the power state (e.g., ON, OFF) of an information presentation device such as, for example, the example information presentation device 102 of FIG. 1. In addition to the functionality described above in connection with the example meter 120 of FIGS. 1 and/or 2, the example meter 1420 of FIG. 14 monitors alternate indications that the example information presentation device 102 is in an ON state. For example, if audio data is being detected from the information presentation device 102, the information presentation device 102 is assumed to be in an ON power state. Monitoring alternate indications that the information presentation device 102 is in an ON power state is useful when, for example, the information presentation device 102 is considered to be in the indeterminate state (as described above in connection with FIGS. 10 and 11). For example, rather than waiting the duration of the delay period before determining the information presentation device 102 is in an ON power state (e.g., during the time period between T7 and T9 in the example graph of FIG. 11), detection of an alternate indication the information presentation device 102 is in an ON power state can interrupt (e.g., terminate) the delay period and real-time state detections of the information presentation device 102 can resume. Additionally, a new ON state power measurement and a new ON threshold can be calculated based on the received power measurement from the example sensor 110 of FIGS. 1 and/or 2 when the alternate indication is received.

The example meter 1420 of FIG. 14 includes an example input interface 301, an example calibrator 320, an example state detector 370, an example chart storage device 392, an example threshold storage device 394 and an example state ID storage device 396 that function similarly to the counterpart components of the example meter 120 of FIGS. 1 and/or 3. Because of the similarity of the like numbered components, those components from FIGS. 1 and/or 3 are not re-described here. Instead, the interested reader is referred to the above description for a complete description of those components. To monitor for alternate indications of an ON state, the example meter 1420 of FIG. 14 includes an interrupt detector 1402 and one or more sensors 1405.

The example interrupt detector 1402 of FIG. 14 monitors alternate inputs to determine whether the example information presentation device 102 is in an ON power state. For example, the interrupt detector 1402 may monitor whether audio data is being received from the example information presentation device 102 via the sensor(s) 1405. In some examples, the sensor(s) 1405 monitor whether video data, digital video data, digital audio data and/or data via a USB interface is being received from the example information presentation device 102. Additionally and/or alternatively, the example sensor(s) 1405 may monitor whether radio frequency (RF) and/or infrared (IF) data is being received by the information presentation device 102 (e.g., from a remote control). When the example interrupt detector 1402 of FIG. 14 determines the example information presentation device 102 is in an ON power state based on the received alternate input via the example sensor(s) 1405, the example interrupt detector 1402 retrieves the power state information from the state detector 370 of FIG. 14 as the power state information is calculated as described above in connection with FIGS. 4 and 6. When the power state information indicates the information presentation device 102 is in an indeterminate state, the interrupt detector 1402 outputs an interrupt indication to the example state detector 370 of FIG. 14 and the example calibrator 320 of FIG. 14.

When the example state detector 370 of FIG. 14 receives an interrupt indication from the example interrupt detector 1402, the example state detector 370 interrupts the delay period initiated by the example timer 1078 of FIG. 10. The example creditor 1082 receives the interrupt indication from the example interrupt detector 1402 and outputs an indication that the information presentation device 102 is in an ON state. In the illustrated example, the example state detector 370 indicates an ON power state when it receives the interrupt indicator from the example interrupt detector 1402 because the example interrupt detector 1402 received positive indication (e.g., audio data from the information presentation device 102, IR data from a remote control, etc.) from the example sensor(s) 1405 that the information presentation device 102 is in an ON power state. For example, as described above in connection with the example graph 1100 of FIG. 11, while the state detector 370 is operating in the indeterminate state (e.g., during the time period between T7 and T9 in the example graph of FIG. 11), the state detector 370 is waiting to see if the power drawn by the information presentation device 102 drops below the OFF threshold during the delay period or if the power measurement increases above the ON threshold. However, if, while in the indeterminate state (e.g., during the time period between T7 and T9), audio data from the information presentation device 102 is received, the information presentation device 102 is known to be in an ON state. This is because audio data would not be received from the information presentation device 102 while in an OFF state. As a result, the example state detector 370 does not need to wait for the delay period to expire before determining the information presentation device 102 is in an ON state. In the illustrated example, the state detector 370 also resumes real-time state detection (e.g., exits the delay period).

In the example of FIG. 14, when the example calibrator 320 receives the interrupt indication from the example interrupt indicator 1402, the example calibrator 320 interrupts the calibration period. As described above, the example interrupt detector 1402 outputs an interrupt indication while the example state detector 370 is operating in the indeterminate state and when a positive indication that the information presentation device 102 is in an ON power state (e.g., audio data received from the information presentation device 102) is received from the example sensor(s) 1405. As a result of the received interrupt indication, the example calibrator 320 determines the stored ON threshold is incorrect because the information presentation device 102 is in an ON power state while the power measurement received from the example sensor 110 of FIGS. 1 and/or 2 is less than the ON threshold. The example calibrator 320 calculates a new ON state power measurement equal to the received power measurement from the example sensor 110 of FIGS. 1 and/or 2 when the interrupt indication was received from the example interrupt detector 1402. This calculation is valid because the received power measurement from the example sensor 110 is below the ON threshold (e.g., the information presentation device 102 is in the indeterminate state), but the information presentation device 102 is known to be in an ON power state (e.g., received interrupt indication). Thus, the ON state power measurement can be adjusted to match the received power measurement when the interrupt indication was received.

As described above in connection with the example ON threshold calculator 650 of FIG. 6, once the ON state power measurement is known, the example ON threshold calculator 650 calculates an ON threshold using a graduated scale such as, for example, the scale represented in the example table 900 of FIG. 9. This new ON threshold is then stored in the example threshold storage device 394 and is used by the example state detector 370 during state detection of the information presentation device 102 (e.g., real-time state detection). In the illustrated example, the example time logger 422 of FIG. 4 also resets the calibration period when the interrupt indication is received from the example interrupt detector 1402. In other words, a new calibration period (e.g., recalibration mode calibration period) is initiated.

While an example manner of implementing the meter 1420 of FIG. 1 has been illustrated in FIG. 14, one or more of the elements, processes, and/or devices illustrated in FIG. 14 may be combined, divided, re-arranged, omitted, and/or implemented in any other way. Further, the example calibrator 320, the example state detector 370, the example interrupt detector 1402 and/or, more generally, the example meter 1420 of FIG. 14 may be implemented by hardware, software, firmware and/or any combination of hardware, software and/or firmware. Thus, for example, any of the example calibrator 320, the example state detector 370, the example chart storage device 392, the example threshold storage device 394, the example state ID storage device 396, the example interrupt detector 1402 and/or, more generally, the example meter 1420 of FIG. 14 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example calibrator 320, the example state detector 370, the example chart storage device 392, the example threshold storage device 394, the example state ID storage device 396, and/or the example interrupt detector 1402 are hereby expressly defined to include a tangible computer readable medium such as a memory, DVD, CD, Blu-ray, etc. storing the software and/or firmware. Further still, the example meter 1420 of FIG. 14 may include one or more elements, processes and/or devices in addition to, or instead of, those illustrated in FIG. 14, and/or may include more than one of any or all of the illustrated elements, processes and devices.

FIG. 15 is a flowchart representative of example machine readable instructions that may be executed to implement the example meter of FIG. 14. The example of FIG. 15 begins similar to the example of FIG. 12 with an activation of the example meter 1420 (block 1400). The corresponding blocks between FIGS. 12 and 15 are similar and were described above in connection with the example of FIG. 12. Thus, a description of the blocks FIG. 15 and FIG. 12 have in common will not be repeated here. The example of FIG. 15 differs from the example of FIG. 12 in that it includes a determination of whether an interrupt indication from the example interrupt detector 1402 was received during the delay period (block 1532). If an interrupt indication from the example interrupt detector 1402 is not received by the example state detector 370 during the delay period, then the state detector 370 determines whether the delay period expired (block 1534). When the delay period has expired, then the example process of FIG. 15 resumes the example process of FIG. 12 at block 1235 and the example state detector 370 monitors whether the values received from the example sensor 110 drop below the OFF threshold (block 1235). Otherwise, if the delay period is not over, the example state detector 370 resumes monitoring whether an interrupt indication was received by the example interrupt detector 1402 (block 1532).

When an interrupt indication is received by the example state detector 370 during the delay period (block 1532), the example state detector 370 determines the example information presentation device 102 is in the ON state (block 1547). When the power state of the example information presentation device has been determined (e.g., block 1547), the example state detector 370 stores the ON power state in the example state ID storage device 396 (block 1549). Additionally, the example calibrator 320 recalibrates the ON threshold (block 1551). As described above in connection with the example calibrator 320 of FIG. 14, when an interrupt indication from the example interrupt detector 1402 is received, a new ON threshold is calculated based on the power measurement received from the example sensor 110 of FIGS. 1 and/or 2 at that time. Control then returns to block 1210.

Figure 16:
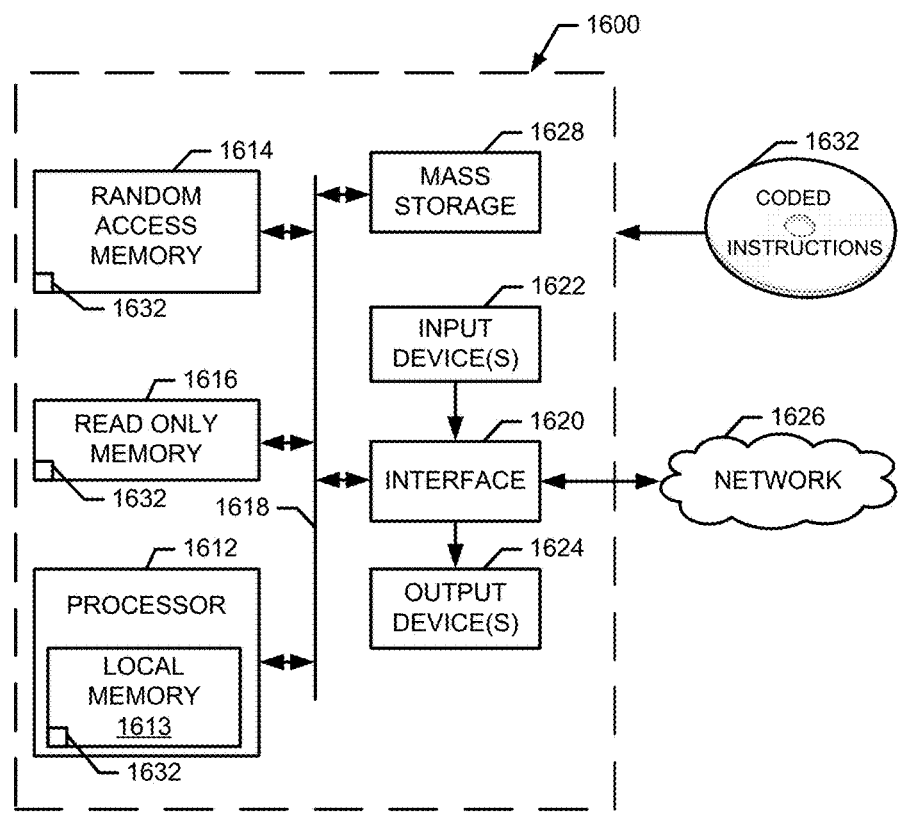
FIG. 16 is a block diagram of an example processing platform capable of executing the example machine readable instructions of FIGS. 12, 13 and 15 to implement the example meter of FIGS. 1, 3 and/or 14.

FIG. 16 is a block diagram of an example processing platform 1600 capable of executing the instructions of FIGS. 12 and 13 to implement, for example, the meter 120 of FIGS. 1 and/or 3. The processing platform 1600 can be, for example, a server, a personal computer, an audience measurement entity, an Internet appliance, a DVD player, a CD player, a digital video recorder, a Blu-ray player, a gaming console, a personal video recorder, a set top box, or any other type of computing device.

The processing platform 1600 of the instant example includes a processor 1612. For example, the processor 1612 can be implemented by one or more microprocessors or controllers from any desired family or manufacturer.

The processor 1612 includes a local memory 1613 (e.g., a cache) and is in communication with a main memory including a volatile memory 1614 and a non-volatile memory 1616 via a bus 1618. The volatile memory 1614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1616 may be implemented by flash memory and/or any other desired type of memory device. Access to the main memory 1614, 1616 is controlled by a memory controller.

The processing platform 1600 also includes an interface circuit 1620. The interface circuit 1620 may be implemented by any type of interface standard, such as an Ethernet interface, a universal serial bus (USB), and/or a PCI express interface.

One or more input devices 1622 are connected to the interface circuit 1620. The input device(s) 1622 permit a user to enter data and commands into the processor 1612. The input device(s) can be implemented by, for example, a keyboard, a mouse, a touchscreen, a track-pad, a trackball, isopoint and/or a voice recognition system.

One or more output devices 1624 are also connected to the interface circuit 1620. The output devices 1624 can be implemented, for example, by display devices (e.g., a liquid crystal display, a cathode ray tube display (CRT), a printer and/or speakers). The interface circuit 1620, thus, typically includes a graphics driver card.

The interface circuit 1620 also includes a communication device such as a modem or network interface card to facilitate exchange of data with external computers via a network 1626 (e.g., an Ethernet connection, a digital subscriber line (DSL), a telephone line, coaxial cable, a cellular telephone system, etc.).

The processing platform 1600 also includes one or more mass storage devices 1628 for storing software and data. Examples of such mass storage devices 1628 include floppy disk drives, hard drive disks, compact disk drives and digital versatile disk (DVD) drives. The mass storage device 1628 may implement the local storage device.

The coded instructions 1632 of FIGS. 12 and 13 may be stored in the mass storage device 1628, in the volatile memory 1614, in the non-volatile memory 1616, and/or on a removable storage medium such as a CD or DVD.

From the foregoing, it will be appreciated that disclosed methods, apparatus and articles of manufacture eliminate the need for manual calibration of the thresholds (e.g., OFF threshold, ON threshold) used during state detection (e.g., OFF, ON) of an information presentation device. Furthermore, disclosed methods, apparatus and articles of manufacture adapt to new information presentation devices and improve accuracy in state detection (e.g., OFF, ON) of the monitored information presentation device. Disclosed methods, apparatus and articles of manufacture recalibrate thresholds for information presentation devices that may change their power draw while in the OFF power state or can significantly decrease their power consumption while in the ON power state such as, for example, in an energy saver mode.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. A method to determine a power state of an information presentation device, the method comprising:
   measuring power drawn by the information presentation device during a calibration period to generate a log of measurement values;
   determining, by executing an instruction with a processor, a first count indicating a number of times a first one of the measurement values was detected during the calibration period, and a second count indicating a number of times a second one of the measurement values was detected during the calibration period;
   identifying, by executing an instruction with the processor, first and second most frequently logged measurement values based on the first and second counts after expiration of the calibration period, the first count of the first most frequently logged measurement value is greater than the second count of the second most frequently logged measurement value;
   determining, by executing an instruction with the processor, the second most frequently logged measurement value to be a first power state measurement;
   calculating, by executing an instruction with the processor, a first threshold as a product of the first power state measurement and a first multiplier; and
   determining whether the presentation device is in an ON state based on a comparison of (a) measured power drawn by the information presentation device after the calibration period to (b) the first threshold.

2. The method as defined in claim 1, further including selecting the first multiplier based on a value of the first power state measurement.

3. The method as defined in claim 1, further including:
   designating the first most frequently logged measurement to be a second power state measurement when the calibration period is in a first mode; and
   determining the second power state measurement to be a product of the first power state measurement and a second multiplier when the calibration period is in a second mode.

4. The method as defined in claim 3, further including:
   calculating a second threshold as a product of the second power state measurement and a third multiplier, the third multiplier different than the first multiplier.

5. The method as defined in claim 4, further including:
   identifying a difference between the first threshold and the second threshold; and
   storing the first threshold and the second threshold when the difference between the first threshold and the second threshold is greater than an ON/OFF difference threshold.

6. The method as defined in claim 5, further including storing a previously calculated first threshold and second threshold when the difference between the first threshold and the second threshold is less than the ON/OFF difference threshold.

7. An apparatus to determine a power state of an information presentation device, the apparatus comprising:

a sensor to measure power drawn by the information presentation device during a calibration period to generate a log of measurement values;

a chart generator to determine a first count indicating a number of times a first one of the measurement values was detected during the calibration period, and a second count indicating a number of times a second one of the measurement values was detected during the calibration period;

a chart analyzer to identify first and second most frequently logged measurement values based on the first and second counts after expiration of the calibration period;

a power level calculator to determine the lesser valued measurement of the first and second identified measurements as a first power state measurement;

a threshold calculator to calculate a first threshold as a product of the first power state measurement and a first multiplier; and a state detector to determine whether the presentation device is in an ON state based on a comparison of (a) measured power drawn by the information presentation device after the calibration period to (b) the first threshold.

8. The apparatus as defined in claim 7, wherein the threshold calculator is to select the first multiplier based on the value of the first power state measurement.

9. The apparatus as defined in claim 7, further including:
a timer to identify whether the calibration period is in a first mode or a second mode; and wherein:
the power level calculator to determine the greater valued measurement of the two identified measurements to be a second power state measurement when the calibration period is in the first mode; and
the power level calculator is to determine the second power state measurement to be a product of the first power state measurement and a third multiplier when the calibration period is in the second mode.

10. The apparatus as defined in claim 7, wherein the threshold calculator is further to calculate a second threshold as a product of a second power state measurement and a second multiplier, the second multiplier different than the first multiplier.

11. The apparatus as defined in claim 10, further including:
a thresholds checker to compare the first threshold to the second threshold and to store the first threshold and the second threshold when a difference between the first threshold and the second threshold is greater than an ON/OFF difference threshold.

12. The apparatus as defined in claim 11, wherein the thresholds checker is to store a previously calculated first threshold and second threshold when the difference between the first threshold and the second threshold is less than the ON/OFF difference threshold.

13. The apparatus as defined in claim 10, wherein the state detector is to determine whether the presentation device is in an OFF state based on a comparison of (a) measured power drawn by the information presentation device after the calibration period to (b) the second threshold.

14. A non-transitory computer readable storage medium comprising instructions that, when executed, cause a machine to at least:
measure power drawn by the information presentation device during a calibration period to generate a log of measurement values;
determine a first count indicating a number of times a first one of the measurement values was detected during the calibration period, and a second count indicating a number of times a second one of the measurement values was detected during the calibration period;
identify first and second most frequently logged measurement values based on the first and second counts after expiration of the calibration period, the first count of the first most frequently logged measurement value is greater than the second count of the second most frequently logged measurement value;
determine the second most frequently logged measurement value as a first power state measurement;
calculate a first threshold as a product of the first power state measurement and a first multiplier; and
determine whether the presentation device is in an ON state based on a comparison of (a) measured power drawn by the information presentation device after the calibration period to (b) the first threshold.

15. The non-transitory computer readable storage medium as defined in claim 14, the instructions to cause the machine to, select the multiplier based on the value of the first power state measurement.

16. The non-transitory computer readable storage medium as defined in claim 14, the instructions to cause the machine to, when the calibration period is in a first mode:
designate the second most frequently logged measurement value as a second power state measurement.

17. The non-transitory computer readable storage medium as defined in claim 14, the instructions to cause the machine to, when the calibration period is in a second mode:
determine the second power state measurement as a product of the first power state measurement and a third multiplier.

18. The non-transitory computer readable storage medium as defined in claim 14, the instructions to cause the machine to:
identify a difference between the first threshold and a second threshold; and
store the first threshold and the second threshold when the difference between the first threshold and the second threshold is greater than an ON/OFF difference threshold.

19. The non-transitory computer readable storage medium as defined in claim 18, the instructions to cause the machine to, when the difference between the first threshold and the second threshold is less than the ON/OFF difference threshold:
store a previously calculated first threshold and second threshold.

* * * * *